US012574672B2

(12) United States Patent
Narampanawe et al.

(10) Patent No.: US 12,574,672 B2
(45) Date of Patent: Mar. 10, 2026

(54) CHARGING COIL FOR A HEARING AID CHARGER, HEARING AID CHARGER AND WIRELESS CHARGING SYSTEM

(71) Applicant: Sivantos Pte. Ltd., Singapore (SG)

(72) Inventors: Nishshanka Bandara Narampanawe, Singapore (SG); Heng Goh Yap, Singapore (SG); Sooriya Bandara Rathnayaka Mudiyanselage, Singapore (SG); Chee Kong Siew, Singapore (SG); Paul Rebers, BM Enschede (NL); Koen J. Weijand, L'Alfas del Pi (ES)

(73) Assignee: Sivantos Pte. Ltd., Singapore (SG)

( * ) Notice: Subject to any disclaimer, the term of this patent is extended or adjusted under 35 U.S.C. 154(b) by 208 days.

(21) Appl. No.: 18/454,231

(22) Filed: Aug. 23, 2023

(65) Prior Publication Data

US 2023/0403492 A1     Dec. 14, 2023

Related U.S. Application Data

(63) Continuation of application No. PCT/SG2021/050228, filed on Apr. 22, 2021.

(51) Int. Cl.
| | |
|---|---|
| *H04R 25/00* | (2006.01) |
| *H04R 1/1025* | (2026.01) |
| *H05K 1/181* | (2026.01) |

(52) U.S. Cl.
CPC ........... *H04R 1/1025* (2013.01); *H04R 25/30* (2013.01); *H04R 25/609* (2019.05); *H05K 1/181* (2013.01); *H05K 2201/10287* (2013.01)

(58) Field of Classification Search
CPC . H04R 1/1025; H04R 25/609; H04R 2225/31
USPC ......................................................... 381/323
See application file for complete search history.

(56) References Cited

U.S. PATENT DOCUMENTS

| | | | | |
|---|---|---|---|---|
| 5,574,273 | A * | 11/1996 | Nakagawa | ......... G06K 7/10336 235/441 |
| 10,366,828 | B2 | 7/2019 | Park et al. | |
| 2004/0098068 | A1* | 5/2004 | Carbunaru | ......... A61N 1/37276 607/60 |
| 2008/0046034 | A1 | 2/2008 | Ibrahim | |
| 2011/0248673 | A1* | 10/2011 | Aerts | .................... H02J 7/0044 320/108 |

(Continued)

FOREIGN PATENT DOCUMENTS

WO          2015167099 A1      11/2015

OTHER PUBLICATIONS

Kuo Ron-Chi et al, "In-Vehicles Wireless Charging System for Portable Devices", 2015 IEEE 82nd Vehicular Technology Conference (VTC2015-FALL), IEEE,Sep. 6, 2015 (Sep. 6, 2015), p. 1-3, XP032857163, DOI: 10.1109/VTCFALL.2015.7390995, figures 1,3, Section II.

*Primary Examiner* — Katherine A Faley
(74) *Attorney, Agent, or Firm* — Laurence A. Greenberg; Werner H. Stemer; Ralph E. Locher

(57) ABSTRACT

A charging coil for a hearing aid charger for magnetic resonance charging of a hearing aid. The charging coil has a printed circuit board coil and a frame shaped ferrite tile with a central opening for receiving and securing the hearing aid. The printed circuit board coil is arranged on the frame shaped ferrite tile.

27 Claims, 15 Drawing Sheets

(56)          References Cited

U.S. PATENT DOCUMENTS

2019/0089187 A1 *   3/2019   Konomi .................. H01F 38/14
2020/0251929 A1      8/2020   Partovi

* cited by examiner

CHARGING COIL FOR A HEARING AID CHARGER, HEARING AID CHARGER AND WIRELESS CHARGING SYSTEM

CROSS-REFERENCE TO RELATED APPLICATION

This application is a continuation, under 35 U.S.C. § 120, of copending International Patent Application PCT/SG2021/050228, filed Apr. 22, 2021, which designated the United States; the prior application is herewith incorporated by reference in its entirety.

FIELD AND BACKGROUND OF THE INVENTION

The invention relates to a charging or transmitter coil for a hearing aid charger. The invention further relates to a hearing aid charger with such a charging coil, and to a wireless charging system containing the hearing aid charger and a hearing aid.

Hearing aids (hearing aid devices) are portable hearing devices that are used to provide care for the hard of hearing or hearing impaired. In order to meet the numerous individual needs, different types of hearing aids are available, such as behind-the-ear hearing aids (BTE) and hearing aids with an external receiver (RIC: receiver in the canal) as well as in-the-ear hearing aids (ITE). The hearing aids listed as examples are worn on the outer ear or in the ear canal of a hearing aid user. In addition, bone conduction hearing aids, implantable or vibrotactile hearing aids are also available on the market. These aids stimulate the damaged hearing either mechanically or electrically.

In principle, the main components of such hearing aids are an input transducer, an amplifier and an output transducer. The input transducer is usually an acousto-electric transducer, such as a microphone, and/or an electromagnetic receiver, such as an induction coil or an (radio frequency, RF) antenna. The output transducer is usually an electro-acoustic transducer, for example a miniature loudspeaker (receiver), or an electromechanical transducer, for example a bone conduction receiver. The amplifier is usually integrated into a signal processing device.

Hearing aids are usually powered by batteries. The operating time is limited depending on the energy content of the batteries and the requirements of the hearing aid. In view of the general trend towards miniaturisation, batteries with a small size are preferred, which additionally limits their energy content.

In order to avoid frequent replacement of used batteries, hearing aids can be operated with rechargeable batteries (accumulators), such as nickel metal hydride (NiMH) or lithium-ion (Li-ion) batteries.

Batteries of hearing aids are usually charged galvanically via metal contacts on the device. For regulatory reasons, medical devices in an increasing number of countries are not allowed to have open live parts. In addition, moisture, perspiration and other electrolyte-containing liquids and impurities can lead to corrosion of the metal contacts.

To avoid galvanic metal contacts, wireless charging systems can be used. Such a wireless charging system essentially contains two components, a transmitter and a receiver. The transmitter plays an important role to generate and deliver energy to the receiver. The transmitter is formed by a charger circuit and transmitter coil. A receiver coil is usually defined as the wireless charging receiver.

The transmitter coil is usually integrated into a stationary (hearing aid-external) charging device or hearing aid charger, while the receiver coil is integrated into the hearing aid and is coupled to the battery. The operation of wireless charging is the induction of an electromagnetic field in the (secondary) receiver coil when current is fluctuating in the (primary) transmitter coil. The receiver coil exposed to the varying electromagnetic field will capture the magnetic energy and convert it into electrical energy for the battery. Conventionally, a wire made of copper material is utilized to form a transmitter coil since its low ohmic resistance reduces energy losses due to heat generation.

Inductive charging systems usually require that the transmitter coil size and receiver coil size is one to one or in the same size scale, which limits the freedom of placement between receiver coil and transmitter coil. For the purpose of maximizing the energy transfer between the induction coils, the receiver coil must be placed close to the transmitter coil and in the same orientation to achieve a good coupling factor. Such a positioning or alignment is especially complicated with ITE hearing aids, which are usually custom-made for the ear canal of the hearing aid user. Therefore, the shape of ITE hearing aids differs from one device to another, since the human ear canal mould shape is different from one person to another.

Custom hearing aids of this kind have various form factors, which generates a problem of the receiver coil having different tilt angles and different distances for every single ITE hearing aid when placed into the charger device. Hence, it is necessary to take into account the ITE hearing aid size and dimension when designing the transmitter coil. The transmitter coil must be able to fit into the case of the charger device, and cater to the largest form factor of the ITE hearing aid. The transmitter coil must further be designed with the capability of performing charging when receiver coil of the ITE hearing aid is inserted into the charger device regardless of the form factor. The high degree freedom of placement for receiver coils in ITE hearing aids generally results in a low coupling factor between transmitter and receiver coils.

To achieve a high degree of placement freedom for the receiver, magnetic resonant (MR) charging can be used instead of inductive charging. MR charging can overcome low coupling factor while preserving a high efficiency. For MR charging a high-quality factor for both the transmitter coil and the receiver coil at the resonance frequency is desired. Due to the possibility of using a low coupling factor it is possible to use a loose placement for the receiver on the top of the transmitter. As such, the receiver coil size can be reduced with respect to the transmitter coil size, i.e. the receiver coil can be designed smaller than the transmitter coil.

The transmitter coil size is dependent on the largest form factor of the ITE hearing aid. A big transmitter coil design is to cater to all range of ITE custom hearing aid size to be chargeable. Overall, the MR charging has the benefit of allowing for a large charging gap distance over 20 mm (millimetre), and a high tilt angle up to 60 degrees, as well as a higher efficiency than induction charging at low coupling factors, and low heat dissipation at the receiver.

SUMMARY OF THE INVENTION

The invention is based on the task of specifying a particularly suitable charging coil, especially for MR charging of an ITE hearing aid. The invention is further based on the task of specifying a particular suitable hearing aid charger and a particular suitable wireless charging device.

With regard to the charging coil, the task is solved with the features of the independent charging coil claim and with regard to the hearing aid charger with the features of the independent hearing aid charger claim and with regard to the wireless charging system with the features of the independent wireless charging system claim according to the invention. Advantageous designs and further training are the subject of the subclaims.

The advantages and designs mentioned with regard to the charging coil are also transferable to the hearing aid charger and/or the wireless charging system and vice versa. The conjunction "and/or" is to be understood here and in the following in such a way that the characteristics linked by means of this conjunction can be formed both jointly and as alternatives to each other.

The charging coil according to the invention is intended for a hearing aid charger, in particular a wireless hearing aid charger, and is suitable and set up for it. The charging coil is especially designed as a transmitter coil of the hearing aid charger, and is intended and set up for a wireless magnetic resonance (MR) charging of a hearing aid.

The charging coil also referred to as transmitter coil below contains a printed circuit board coil (PCB coil) and a frame shaped ferrite tile. The PCB coil is arranged on the ferrite tile. In other words, the invented transmitter coil is made of a conductive PCB trace and attaches with a ferrite tile to form a transmitter ferrite PCB coil. The charging coil, i.e. the PCB coil and/or the ferrite tile, further contains a central opening for receiving the hearing aid. This creates a particularly suitable charging coil for a hearing aid charger.

The ferrite tile is a component to direct the magnetic field generated by the PCB coil. Adding the ferrite tile increases the PCB coil inductance significantly. Overall, the ferrite tile increases the quality factor and enhances the transmitting performance of the charging coil. Therefore, the attached ferrite tile enhances the charging performance of the charging coil during operation. The length of the ferrite tile is similar to the transmitter PCB coil which is from one edge to another edge. The hollow hole size of the central opening is preferably similar to the transmitter PCB coil size.

In an advantageous design the PCB coil comprises two outer layers as ground reference (ground layer) and at least one inner layer with a coil conductor in between the outer layers (coil layer, transmitter coil trace layer). During operation of the charging coil an (AC) electrical current is flowing through the coil conductor, which generates a magnetic field for the MR charging. In other words, the coil conductor of the at least one inner layer functions as an antenna. Each layer or plane of the PCB coil contains e.g. an insulating (sub)layer with a structured conductive (sub)layer, especially a metallic layer, preferably a copper layer, wherein the conductive layer includes a trace or path that follows a round or looped coil shape. The layers of the PCB coil are axially stacked, i.e. are arranged on top of each other in an axial direction.

The term "axial" or an "axial direction" is understood here and in the following to mean in particular a direction parallel (coaxial) to the central axis of the charging coil, i.e. perpendicular to the end faces of the charging coil. Accordingly, here and in the following, "radial" or a "radial direction" is understood to mean in particular a direction oriented perpendicular (transverse) to the central axis along a radius of the charging coil. The term "tangential" or a "tangential direction" is understood here and in the following to mean in particular a direction along the circumference of the charging coil (circumferential direction, azimuthal direction), i.e. a direction perpendicular to the axial direction and the radial direction.

The outer layers are also referred below as top and bottom layer. Here and in the following, the bottom layer means in particular the outer layer, which is in contact with the ferrite file, i.e. the ferrite tile adjacent layer, independent of the actual orientation in space. The top layer of the charging coil is correspondingly arranged opposite to the ferrite tile. Preferably the electronic components of the PCB coil, such as capacitors, thermistor and pin headers, are arranged on the top layer.

The working principle of the PCB coil is that a magnetic field is generated when current is flowing through the coil conductor, and the outer layers act as ground traces, that cover the coil traces of the coil conductor, and thereby shield the magnetic field outside of the central opening. This results in a concentration of the magnetic field inside the opening, which improves the charging performance and reduces stray magnetic fields in the coil vicinity, thereby reducing (magnetic) crosstalk.

The standard copper coil for hearing aid charges is usually made of a single core copper wire, multiple strand Litz wire, or few layers of PCB copper trace to form a transmitter coil with few windings turns. The charging of such coils typically operates at sub 1 MHz (Megahertz) frequency with micro-Henry scale inductance. The design structure of the standard coil is usually spiral or helical shape with several winding turns. The PCB coil according to the invention preferably utilizes a PCB copper trace with few loops turns in at least one inner layer to form the transmitter coil. The design structure of the invented transmitter coil is the ground trace sandwiches the transmitter coil trace at a certain side edge.

In a suitable formation the outer layers, i.e. the top and bottom layer, a electrically connected by a number of first axial vias. This ensures a simple, compact and reliable contacting of the outer layers, which improves the magnetic field shielding. In the following the first axial vias are also referred to as tunnel shielding vias. The first axial vias or tunnel shielding vias connect the ground traces of the top and bottom layer.

In a possible design the coil conductor is surrounded by the number of first axial vias. The tunnel shielding vias therefore wall-in the electric current flow during operation, which reduces interference.

In an advantageous embodiment of the invention the at least one inner layer comprises at least one conductor strip flanking the coil conductor. Here the conductor strip is connected to the outer layers by a number of second axial vias. The second axial vias therefore connect the outer layers and the conductor strips of the at least one inner layer. Therefore, there is a ground reference in all layers of the PCB coil. This further improves the magnetic shielding in radial and tangential direction, which reduces interference and crosstalk of the charging coil during operation.

An additional or further aspect of the invention provides that the coil conductor contains a number of parallel arranged conductor paths. The conductor paths are parallel copper traces or bands, which are arranged radially and tangentially next to each other in the plane of the corresponding inner layer. By splitting the coil conductor in several parallel conductor paths the surface of the coil conductor is increased. As a result of the skin effect, it is therefore possible to use a higher electrical current in order to generate the magnetic field, thereby improving the charging performance of the charging coil.

In a possible embodiment the PCB coil contains at least two stacked inner layers, wherein the coil conductors of the inner layers are connected by a number of third axial vias. The third axial vias therefore connect the coil conductors or coil traces of different inner layers of the PCB coil. Therefore, the conductor layers are interconnected by the third axial vias and cooperatively form the coil for generating the magnetic field.

For example, each coil conductor of each inner layer is configured as a single coil with multiple winding coil. Via the third axial vias the single coil with two turn winding coils using two conductor traces at two layers are connected and form a single turn windings coil. As such, there is a possibility of a transmitter PCB coil design that comes with a lower overall resistance when a single coil with higher number of winding turns with a higher number inner layers is forming into a single turn winding coil by connecting it through the third axial vias.

In an advantageous embodiment two opposite sides of the outer layers cover the at least one inner layer. Preferably, two perpendicular opposite sides of the inner layer are not covered by the outer layers, and are therefore exposed. For example, the outer layer ground reference path covers the inner layer coil conductor path at the top edge and bottom edge of the PCB. This layout arrangement forms two outer ground reference paths sandwiching the inner layer coil conductor paths and resulting with shielding the magnetic field, which restrict the emission of magnetic field. The magnetic field is concentrated at the top edge and bottom edge of copper trace but not emitted out from the copper coil trace. This layout arrangement can reduce stray fields and supressing the crosstalk effect when two channel transmitter antennas are placed in close proximity next to each other. Consequently, this antenna design structure allows two antennas place side by side to each other with a minimum interference to the adjacent channel. Preferably, the antennas are arranged next to each other along the covered sides.

In a further embodiment the outer layers, especially the copper ground traces of the outer layers, are essentially rectangular shaped with two long sides and two short sides, wherein the long sides are longer than the short sides. Here, the at least one inner layer, especially the conductor trace of the coil conductor, is essentially square shaped, wherein the length of the square sides correspond to the length of the short sides of the outer layers. Hence there is a spacing between the short sides of the outer layer and the inner layer. The spacing is preferably at least partially filled with the ferrite material of the ferrite tile, thereby realizing a "landing gap" for the magnetic field, reducing stray fields and crosstalk.

In a suitable design the edges and/or corners of the layers, especially the outer layers, are trimmed. This realizes a size reduction of the charging coil, which simplifies the integration into a case or housing of the hearing aid charger. Preferably all corners of the PCB coil and ferrite tile are trimmed.

In a conceivable embodiment one of the outer layers is in direct contact with the ferrite tile. This ensures a large increase in the PCB coil inductance.

In a further embodiment the outer layers, especially the copper ground traces of the outer layers, are essentially rectangular shaped with two long sides and two short sides, wherein the long sides are longer than the short sides. Here, the at least one inner layer, especially the conductor trace of the coil conductor, is essentially square shaped, wherein the length of the square sides correspond to the length of the short sides of the outer layers. Hence there is a spacing between the short sides of the outer layer and the square sides of the inner layer parallel to them. The spacing or area is preferably trimmed out, i.e. the material of the PCB is removed, and at least partially filled with a ferrite strip, thereby realizing a "landing gap" for the magnetic field, reducing stray fields and crosstalk.

In an advantageous embodiment the ferrite strip is made of the material of the ferrite tile, i.e. the ferrite tile and the ferrite strip are made in one piece or monolithic.

In an advantageous embodiment the opening is at least partially filled with ferrite material. In other words, the area of the ferrite tile below the opening of the PCB coil is at least partially filled with ferrite. This means that the diameter of the opening of the ferrite tile is reduced compared to the opening of the PCB coil. This increases the coupling factor of the charging coil.

In a suitable embodiment the material of the ferrite tile has a loss tangent smaller or less than 0.004 at a resonance frequency used for the magnetic resonance charging. This realizes a high coupling and high-efficiency wireless charging, the target loss tangent (tan δ) of the ferrite material is preferably be less than 0.004 at 13.56 MHz. This low loss tangent can result in approximately a ten-fold quality factor enhancement of the charging coil. For example, Kasche K40 can be used as material for the ferrite tile. The loss tangent of Kasche K40 ferrite material is 0.00375 at 13.56 MHz.

In a possible embodiment the charging coil further comprises electronic components in form of a tuning circuit, which is integrated into the PCB coil.

In a preferred embodiment the tuning circuit contains a parallel resonance circuit with the coil conductor as inductance. For the tuning capacitor circuit, the standard copper coils used for charging coils usually use a series connection capacitor. For the charging coil, the tuning capacitors circuit is arranged in parallel series with respect to the coil conductor.

In a suitable further development, the tuning circuit comprises a number of capacitors, which are connected in series. A parallel resonance circuit generally has a high impedance. The resulting parallel series capacitors arrangement lowers the input impedance of the tuning circuit, which makes it possible to drive a higher current through the PCB coil in order to generate a stronger charging magnetic field. Furthermore, the parallel series capacitor arrangement has the features of input impedance adjustment, resonant frequency tuning, and antiphase voltage at the coil terminal (differential).

The resonant capacitors are selected to match the transmitter coil inductance to oscillate the transmitting current at the resonant frequency. These capacitors are preferably arranged pairwise in parallel and then in series to the coil conductor. Thereby the capacitor value can be split into two in parallel to have the effect of current stress reduction and resistance reduction.

In a preferred embodiment the resonance frequency of the tuning circuit or resonance circuit is 13.56 MHz (megahertz). In other words, the resonant frequency of MR wireless charging is preferably 13.56 MHz. This frequency is e.g. adopted by RFID and NFC technology, which is used for short-range distance communication. This technology is commonly seen in the market such as credit card contactless payment, public transport payment, etc. The MR charging of the wireless system according to the invention adopts the 13.56 MHz frequency as the wireless charging frequency, because this frequency bandwidth is designated for industrial, scientific, and medical (ISM) applications. Generally, the 13.56 MHz frequency bandwidth of ISM applications is allowed to emit power up to 42 dBuA/m (decibel ampere per metre) at 10 m (meter). This corresponds to a power transfer of 20 mA (milliampere) at 20 mm, which is sufficient for use as MR charging technology for charging an ITE HA.

An additional or further aspect of the invention provides that the tuning circuit contains a thermistor for measuring the temperature of the PCB coil. The thermistor especially measures the temperature of the transmitter coil during the charging operation. The thermistor resistance is temperature dependent and varying along with the temperature e.g. from −20° C. to 120° C. In a suitable embodiment the thermistor position is located touching the ferrite tile to accurately read the transmitter PCB coil charging temperature. The thermistor is especially located at the bottom layer of the PCB coil, preferably in between the bottom layer and an adjacent inner layer. Due to the thermistor one can instantly stop charging when the temperature of the PCB coil hits a certain temperature threshold.

In a possible embodiment the tuning circuit contains a pin header as a connector, which is arranged on the top layer. The pins header is the connector to link up the transmitter coil terminal to the charger circuit board terminal.

The hearing aid charger according to the invention is intended, suitable and set up for wireless charging of a hearing aid, especially an in-the-ear hearing aid (ITE HA). Preferably the hearing aid charger is intended for a MR charging of the ITE HA. The hearing aid charger contains a charger case as housing and at least one integrated charging coil as described above. This realizes a particularly suitable hearing aid charger for charging an ITE HA.

In a preferred embodiment two charging coils are integrated into the charger case. The two charging coils are arranged in a bracket with a central web separating the charging coils. Preferably the bracket is made of an electrically conductive material with low permeability. Low permeability in this context means a permeability, which is lower than that of the charging coil. The central web acts as an electrically conductive material strip, which due to its low permeability reduces or supresses a crosstalk effect between the neighbouring charging coils. In a conceivable embodiment form the bracket is made of aluminium.

The wireless charging system is intended, suitable and set up for a MR charging of a battery or energy store of an ITE HA. The system contains the ITE HA with an integrated receiver coil, and a hearing aid charger as described above. This realizes a particularly suitable wireless charging system.

The resonant frequency of MR wireless charging is preferably 13.56 MHz (megahertz). This frequency is e.g. adopted by RFID and NFC technology, which is used for short-range distance communication. This technology is commonly seen in the market such as credit card contactless payment, public transport payment, etc. The MR charging of the wireless system according to the invention adopts the 13.56 MHz frequency as the wireless charging frequency, because this frequency bandwidth is designated for industrial, scientific, and medical (ISM) applications. Generally, the 13.56 MHz frequency bandwidth of ISM applications is allowed to emit power up to 42 dBuA/m (decibel ampere per metre) at 10 m (meter). This corresponds to a power transfer of 20 mA (milliampere) at 20 mm, which is sufficient for use as MR charging technology for charging an ITE HA.

Other features which are considered as characteristic for the invention are set forth in the appended claims.

Although the invention is illustrated and described herein as embodied in a charging coil for a hearing aid charger, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Parts and pieces corresponding to each other are always marked with the same reference signs in all figures.

Figure 1:
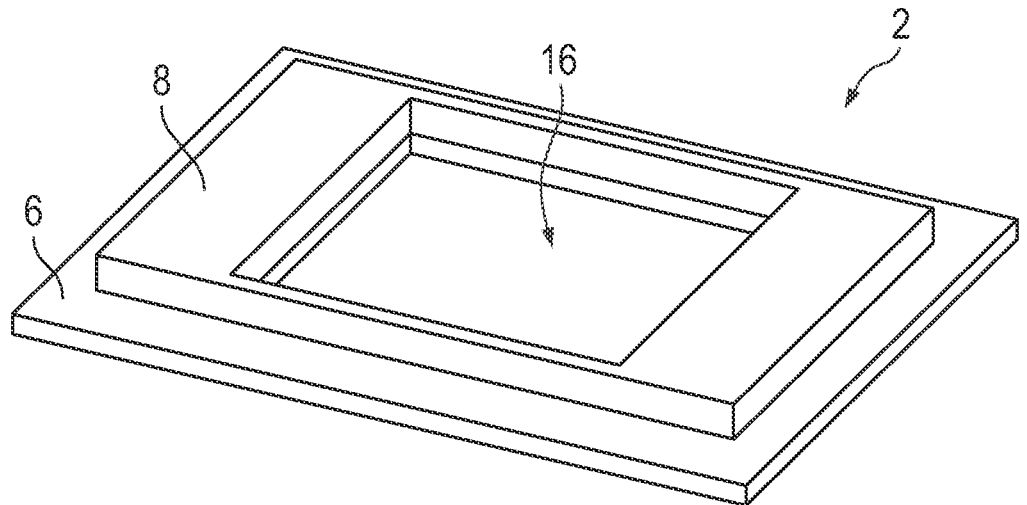
FIG. 1 is a diagrammatic, perspective view of a charging coil with view of a bottom side.
Figure 2:
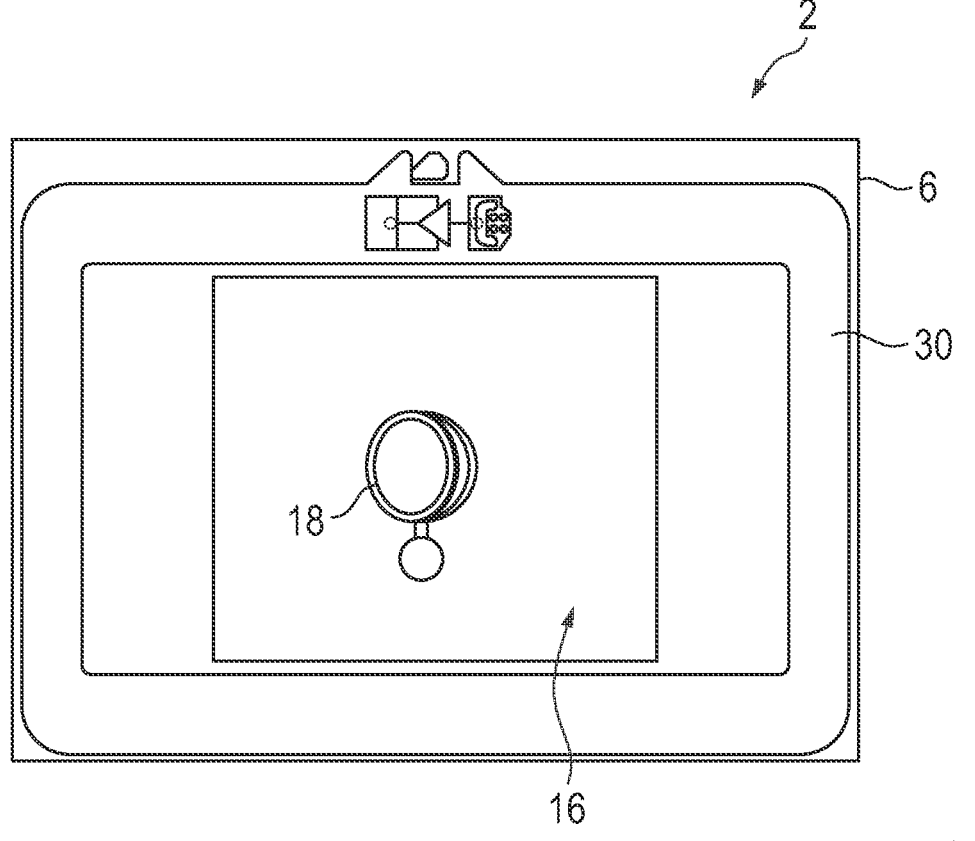
FIG. 2 is a top view of the charging coil.
Figure 10:
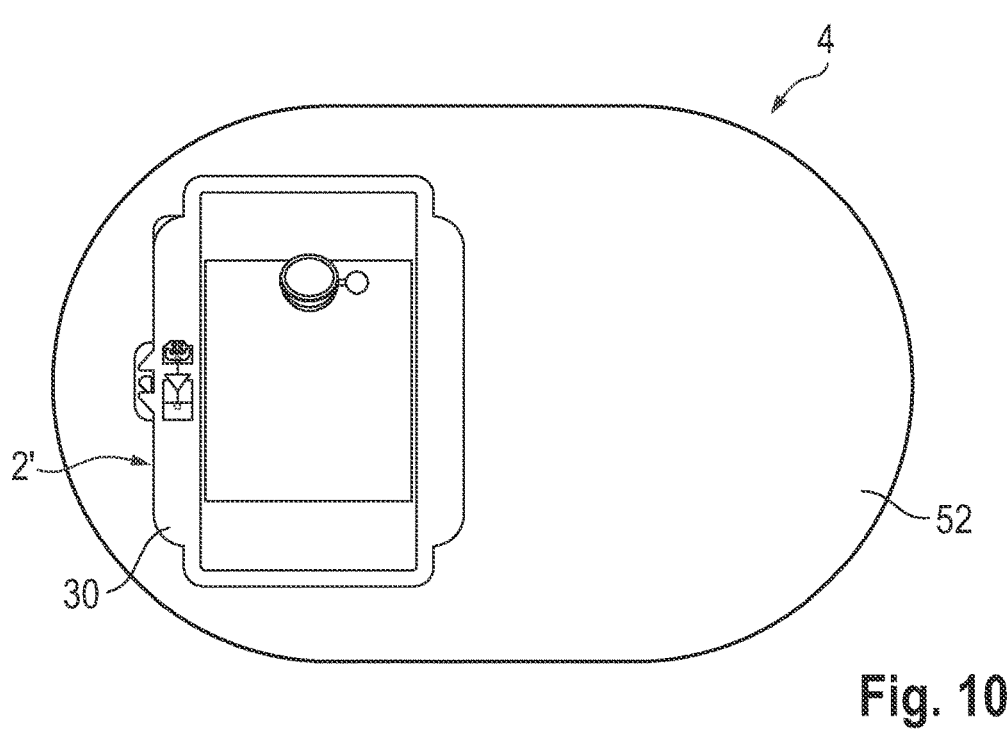
FIG. 10 is a top view showing parts of a hearing aid charger.

Referring now to the figures of the drawings in detail and first, particularly to FIG. 1 thereof, there is shown a charging coil or transmitter coil 2 of hearing aid charger 4 (FIG. 10). The charging coil 2 is configured as a MR charger transmitter ferrite printed circuit board (PCB) coil. The charging coil 2 contains a PCB coil 6 and a frame or bracket shaped ferrite tile 8. The charging coil 2 further contains electronic components such as capacitors 10, thermistor 12, and pin headers 14 (FIG. 5), which are integrated into the PCB coil 6. The charging coil 2 has a central hollow area as an opening 16 for receiving an ITE HA 18 (FIG. 2). In the figures only a receiver of the ITE HA 18 is shown.

The charging coil 2 solves the problem of the cross-talk effect and transmitter-receiver size disparity of in-the-ear hearing aids (ITE-HAs). The PCB coil 6 working principle is that a magnetic field is generated when the current is flowing through a coil or antenna layer and ground layers cover the coil traces, which shields the magnetic field.

The design of the transmitter PCB coil 6 aims to perform a chargeable for large form factor ITE HA and achieve high charging performance at the same time. The charging performance is quantified by using quality factor. A high-quality factor of the transmitter coil 2 implies high charging efficiency. The transmitter coil 2 contains a PCB copper trace attached with a ferrite tile 8 to form a transmitter ferrite PCB coil. FIG. 1 shows the bottom view of the transmitter ferrite PCB coil. The PCB coil 6 has the advantages of high consistency in quality factor, inductance, and resistance parameter from one coil to another, and has electronic components placement, and cross-talk suppression. The attached ferrite tile 8 enhances the charging performance of the charging coil 2 during operation of the hearing aid charger 4.

FIG. 2 shows the charging coil 2 in a top view. The electronic components 10, 12 and pin headers 14 are placed at the top side of the (transmitter) PCB coil 6. The PCB 6 coil has a hollow square hole as opening 16. The receiver in the ITE HA 18 is placed within the transmitter PCB coil 6 opening 16 to perform charging. The dimension of the opening 16 is taken into consideration of fitting the largest ITE HA form factor.

Figure 3A:
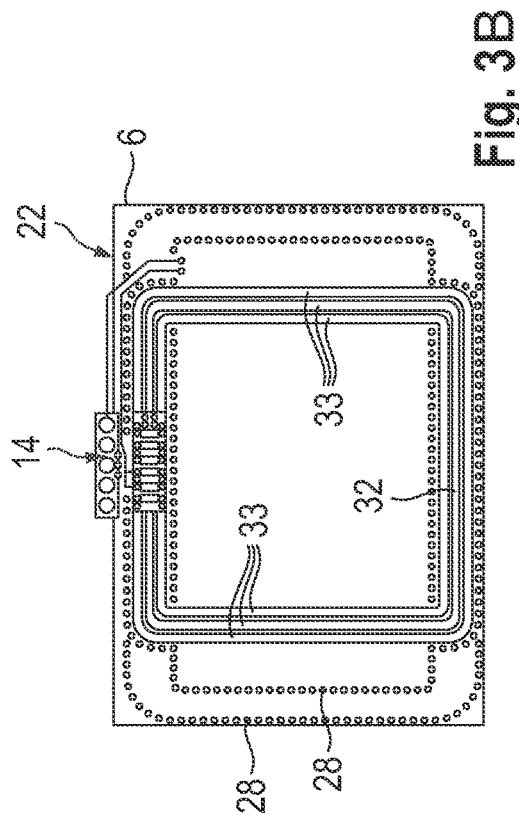
FIGS. 3A to 3D are top views of layers of a PCB coil.
Figure 3B:
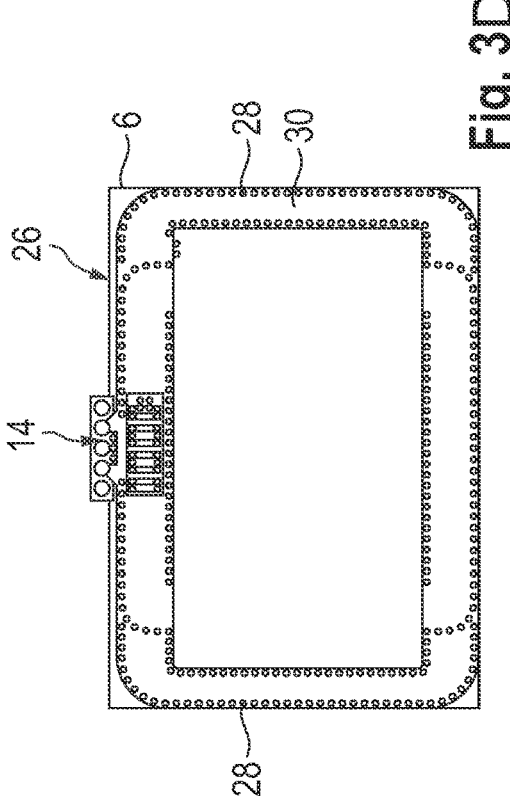
Figure 3C:
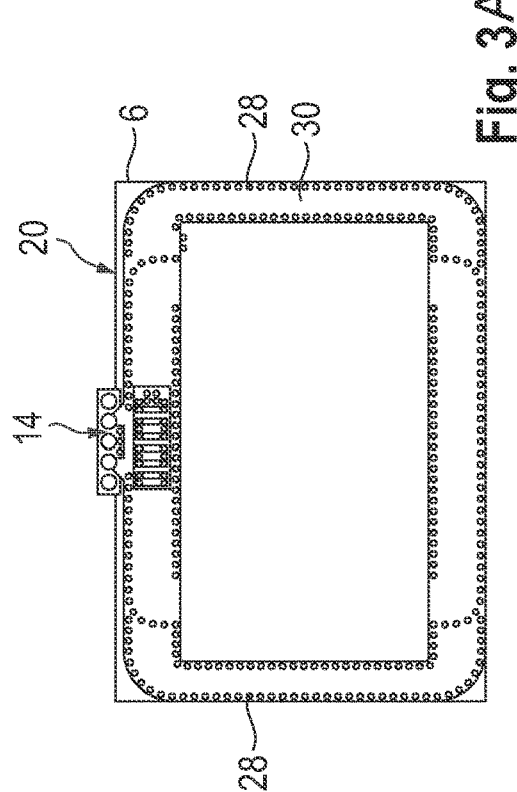
Figure 3D:
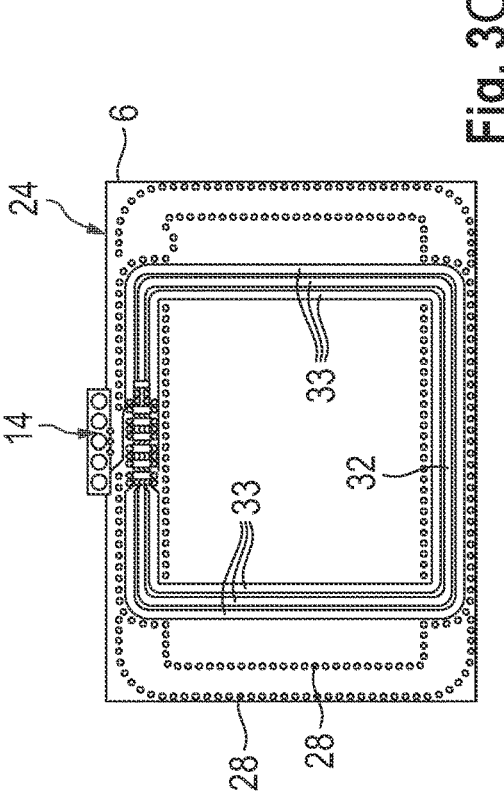

In this embodiment the PCB coil 6 contains four axially stacked layers 20, 22, 24, 26. FIG. 3A shows the top layer 20, FIG. 3B shows a first inner layer 22, FIG. 3C shows a second inner layer 24, and FIG. 3D shows the bottom layer 26 of the transmitter coil design of the PCB coil 6. The top layer 20 and bottom layer 22 are the two opposing outer layers between which the inner layers 22 and 24 are arranged. The top layer 20 and bottom layer 26 are meant for ground reference copper trace only. The five pins header 14 is arranged at a top edge of the transmitter PCB coil 6. There are a number of axial vias 28 punched along the top layer 20 and bottom layer 26 copper trace 30. The vias 28 are only provided with reference signs as an example. These vias 28 along the copper trace 30 are to connect all the ground reference trace of the top layer 20 and bottom layer 26 together to have the effect of reducing overall trace resistance.

The inner layer 22 and inner layer 24 are the transmitter coil trace layer and each comprise a copper trace as coil conductor 32. The coil conductor 32 can be split into three parallel bands or traces as conductor paths 33. Preferably the coil conductor 32 is divided into the conductor paths 33 in the regions which do not overlap with the ground traces 30. The transmitter coil can be designed as one turn winding coil or two turns winding coil. A one turn winding coil utilizes only the inner layer 22 copper trace as the transmitter coil trace and two turns winding coil utilizes both inner layer 22 and inner layer 24 copper trace as the transmitter coil trace. As such, there is a possibility of transmitter PCB coil design that comes with a higher number of winding turns when the PCB fabricated with a higher number of inner layers. Higher winding turns can achieve higher inductance.

Figures 4, 5:
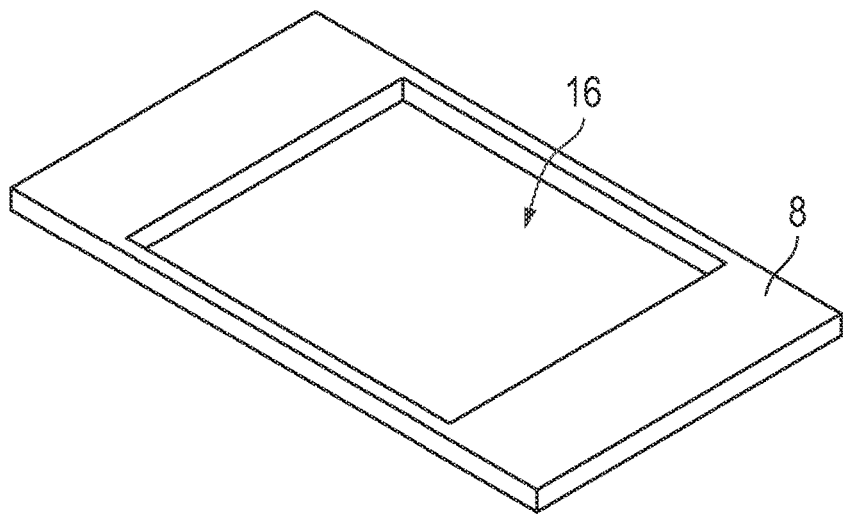
FIG. 4 is a perspective view of a ferrite tile of the charging coil.
FIG. 5 is a block diagram of the charging coil electronics.

The ferrite tile 8 shown individually in FIG. 4 is a component to direct the magnetic field generated by the inner layers 22, 24. Adding the ferrite tile 8 increases the transmitter PCB coil inductance. Overall, the ferrite tile 8 increases the quality factor and enhances the transmitting performance of the charging coil 2. The ferrite tile 8 is attached to the bottom layer 26 of the transmitter PCB coil 6 as e.g. shown in FIG. 1. The length of the ferrite tile 8 is similar to the length of the transmitter PCB coil 6, which is from one edge to another edge. The hollow hole size of the central opening 16 is similar as well.

The ferrite tile material is one of the factors to enhance the quality factor. To qualify the ferrite material, the loss tangent can be used as the index to qualify the ferrite material. The relationship between loss tangent tan δ and quality factor Q is $$\tan \delta = \frac{1}{Q}$$

Low loss tangent tan δ can achieve high-quality factor Q. Alternatively, the loss tangent tan δ is also referred to as the division of the imaginary part relative complex permeability to the real part of relative complex permeability at the target resonant frequency. To achieve high coupling and high-efficiency wireless charging, the target loss tangent tan δ of the ferrite material is preferably be less than 0.004 at 13.56 MHz. This low loss tangent tan δ can result in approximately a tenfold quality factor enhancement.

For example, Kasche K40 can be used as material for the ferrite tile 8. For K40 the imaginary part relative permeability is around 0.15 and the real part relative permeability is around 40 at 13.56 MHz. The obtained loss tangent of Kasche K40 ferrite material is 0.00375 at 13.56 MHz. The calculated lost tangent is lower than the target loss tangent of the ferrite material. Hence, the K40 is an appropriate material to be used as the ferrite tile 8 of the transmitter coil 2.

The ferrite tile thickness determines the magnetic flux density. The thickness of the ferrite tile 8 has no direct impact on the quality factor. However, a thicker ferrite tile 8 can lower the magnetic field density. This is due to the cross-section area of ferrite tile 8 is larger for the same magnetic flux. This can be also be explained as thicker ferrite tile 8 will result in a higher saturation value for the magnetizing field and less heat generated. Hence, the ferrite tile thickness has to be taken into consideration in the transmitter coil design stage to avoid magnetic flux saturation when the system is charging in high power. For K40 the ferrite tile thickness is e.g. 2.0 mm.

Figure 6:
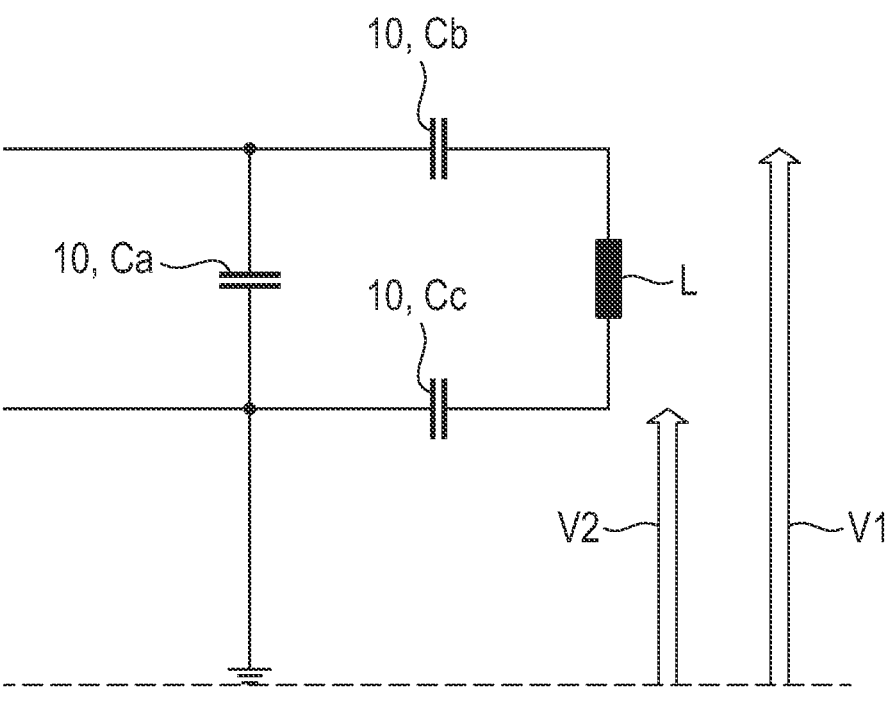
FIG. 6 is an equivalent circuit diagram of the charging coil electronics.

There are essentially three types of electronic components 10, 12, 14 mounted on the transmitter PCB coil 6. FIG. 6 shows the schematic of the transmitter PCB coil 6 with eight electronic components. Each component on the PCB will be detailed explained in the following.

There are six resonant capacitors 10 in total as the tuning circuit of the transmitter coil 2. These capacitors 10 are arranged in parallel and then in series to the coil conductor 32. In the following the capacitance of the capacitors 10 are also labelled as C1, C2, C3, C4, C5, C6. The resonant capacitors 10 are selected to match the transmitter coil inductance (L) to oscillate the transmitting current at the resonant frequency. The equivalent resonant capacitor circuit shown in FIG. 5 can be rearranged as FIG. 6.

A parallel resonance circuit has high impedance. The parallel series capacitors arrangement can lower the input impedance. The overall equivalent resonant capacitors value can be obtained using the resonant frequency equation $$C_{eq} = \frac{1}{(2\pi f)^2 L}$$

where f is the predetermined resonance frequency and L is the measured coil inductance. The arrangement of capacitor and inductor is in parallel and the equivalent resonant capacitors can be obtained as $$\frac{1}{C_{eq}} = \frac{1}{C1 + C2} + \frac{1}{C3 + C4} + \frac{1}{C5 + C6}$$

and $$Ca = C1 + C2$$

$$Cb = C3 + C4$$

$$Cc = C5 + C6$$

The capacitor value is split into two in parallel to have the effect of current stress reduction and resistance reduction.

The schematic of FIG. 6 as a reference to derive the value of these capacitors. The impedance of each capacitor is $$Z_{Ca} = \frac{1}{j\omega Ca}$$

$$Z_{Cb} = \frac{1}{j\omega Cb}$$

$$Z_{cc} = \frac{1}{j\omega Cc}$$

and the coil impedance general equation is $$Z_L = R_L + j\omega L$$

which consists of coil trace resistance $R_L$ and coil inductance L. At the resonance frequency, the summation of capacitors impedance is similar to the imaginary of coil impedance $$Z_{Ca} + Z_{Cb} + Z_{Cc} = \text{Im}(Z_L).$$

Figure 7:
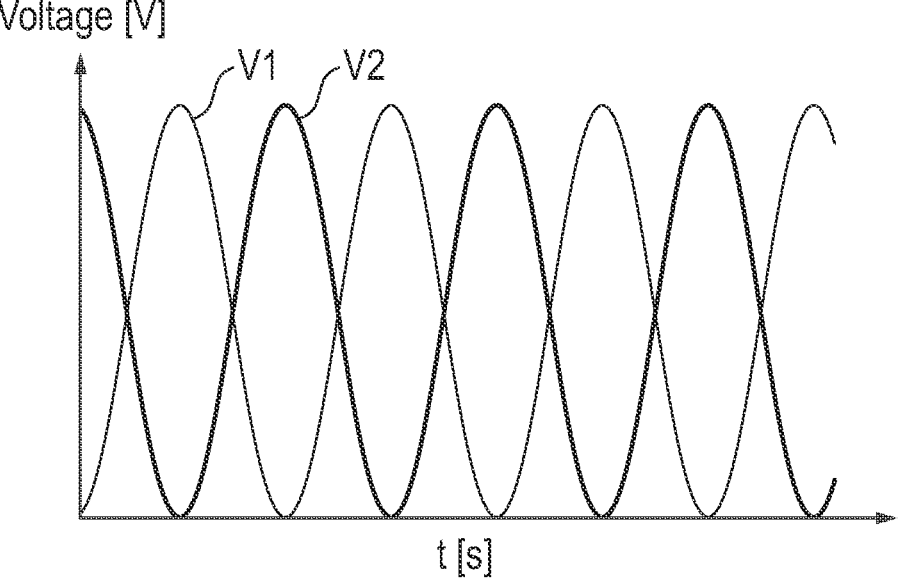
FIG. 7 is a time-voltage-diagram.

Based on the antiphase voltage feature of the coil terminal as shown in the graph of FIG. 7, the voltage magnitude V1 of the coil 32 and capacitor Cc to ground reference is equal to the voltage magnitude V2 of capacitor Cc to ground reference. The phase difference between these two voltages is 180 degree as shown in FIG. 7. Using the equivalent voltage magnitude, one can further derive the Cc capacitor impedance as $$Z_{Cc} = \frac{R_L + \omega L}{2\omega L}$$

The rearrangement of the equations can obtain the summation of capacitor Ca impedance and capacitor Cb impedance as $$Z_{Ca} + Z_{Cb} = \text{Im}(Z_L) - Z_{Cc}$$

The summation of capacitor Ca impedance and capacitor Cb impedance is therefore equal to the difference of imaginary part of coil impedance L and the calculated capacitor Cc impedance, $Z_{Cc}$.

The required current to the transmitter coil 2 depends on the power needed to charge the receiver. High power at the receiver requires more current at the transmitter to generate a stronger magnetic field strength. At the same time, higher current requires higher voltage generated to the transmitter coil for fixed input impedance. Using Ohm's law, a low PCB coil antenna input impedance can have more current flow into the coil that resulting in a strong magnetic field under the same voltage. Hence, an antenna with low input impedance is desired. The parallel capacitor as shown in FIG. 6 can be used as adjusting the input impedance of the antenna to match the transmitter output impedance for maximum power transfer.

Using the circuit arrangement in FIG. 7, the pre-determined input impedance, $Z_{in}$ is the parallel summation of antenna impedance, $Z_{ant}$ and capacitor Ca impedance, $Z_{Ca}$ are $$\frac{1}{Z_{in}} = \frac{1}{Z_{ant}} + \frac{1}{Z_{Ca}}$$

The antenna impedance $Z_{ant}$ is the summation of coil impedance $Z_L$, and two series capacitors impedance $Z_{Cb}$ and $Z_{Cc}$ $$Z_{ant} = Z_L + Z_{Cb} + Z_{Cc}$$

Figure 8:
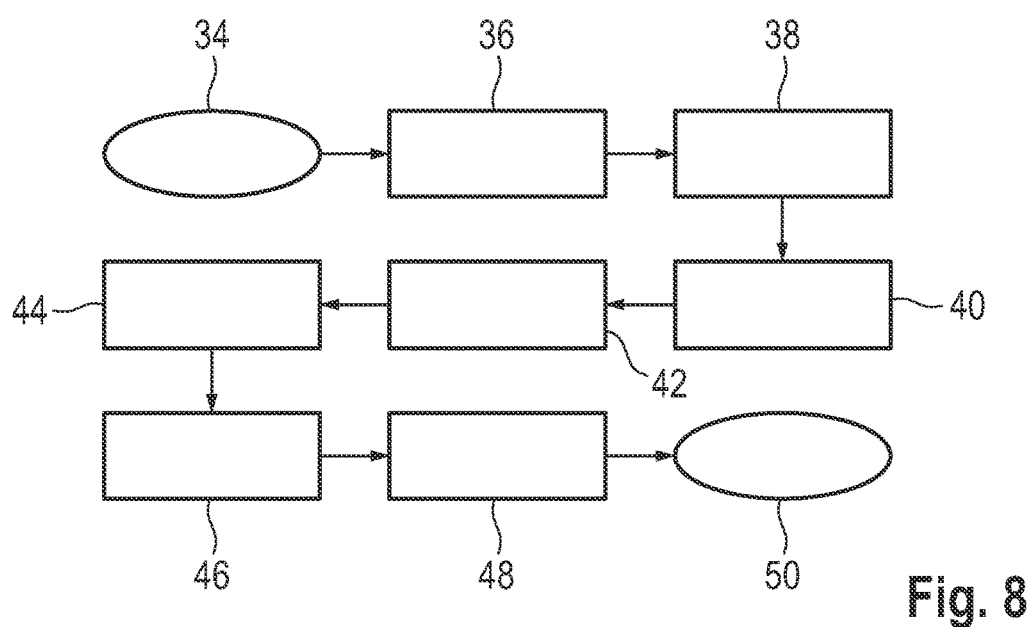
FIG. 8 is a flow diagram for matching the capacitors of the electronics.

A couple of steps are required to obtain all the value of capacitors and the step is termed here as matching capacitor tuning flow. FIG. 8 illustrates said matching capacitors tuning flow. After a start 34, the operating resonance frequency f and the desired output impedance of the charger power amplifier to deliver the required output power are determined in a step 36. The operating resonant frequency f is e.g. 13.56 MHz. The output impedance of the charger power amplifier is the input impedance $Z_{in}$ of the transmitter PCB coil 6. The charger power amplifier output topology could be resistive load or inductive load which would require to deliver different input impedance to the transmitter PCB antenna coil. In a step 38 the inductance L of the coil conductor 32 is measured and the alternating current resistance $R_L$ is determined.

In the following step 40 the summation of all the capacitors impedance, $Z_{Ca} + Z_{Cb} + Z_{Cc}$, is obtained as the imaginary of coil impedance at 13.56 MHz frequency. Similarly, the Cc capacitor impedance, $Z_{Cc}$ is derived in step 42 by inserting the measured coil resistance and inductance parameter at 13.56 MHz frequency. In step 44 the calculated Cc capacitor impedance and the measured imaginary of coil impedance are substituted into the above equation to obtain the summation Ca and Cb capacitors impedance value as $Z_{Ca} + Z_{Cb}$. Then in step 46, the capacitor impedances $Z_{Ca}$ and $Z_{Cb}$ value can be computed by using the simultaneous equation method. Finally, in step 48 each capacitor value C1, C2, C3, C4, C5, C6 is determined from the calculated capacitor impedance value $Z_{Ca}$, $Z_{Cb}$, $Z_{Cc}$. Each capacitor individual value can be calculated by using the above equation with the commercially available capacitor value. Afterwards the matching capacitors tuning flow ends with a step 50.

The thermistor 12 is to perform temperature measurement of the transmitter PCB coil 6 during the charging operation. The thermistor resistance is temperature dependent and varying along with the temperature e.g. from −20° C. to 120° C. The thermistor position is placed touching the ferrite tile 8 to accurately read the transmitter PCB coil charging temperature. The recommended placement of the thermistor is at the bottom layer of the PCB coil 6. The recommended position of the thermistor is in between the copper coil trace 32 and the ground reference trace 30 which is facing the ferrite tile 8. With the thermistor 12 on the transmitter PCB coil 6, one can instantly stop charging when the temperature hits a certain temperature threshold.

The pins header 14 is the connector to link up the transmitter coil terminal to the charger circuit board terminal. Refer to the transmitter PCB coil schematic as shown in FIG. 5, the first pin P1 is the analog input terminal to the load demodulation circuit, pin P2 and pin P4 are the transmitter coil ground reference terminal, pin P3 is the transmitter coil positive terminal, and pin P5 is thermistor terminal.

The analog input terminal P1 is the coil terminal with the current-carrying communication signal. The analog input terminal P1 connects to the demodulation circuit, which can decrypt the communication signal into readable form. The positive and ground reference terminal P2, P3, P4 is the power terminal which generates a magnetic field when the alternate current from the charger circuit board flowing in and out through these terminals. The thermistor terminal P5 is a terminal having a varying voltage when a constant voltage supply and voltage divider at this terminal. The thermistor resistance will change according to the temperature and result in varying the voltage across this terminal.

The major differences between the invented transmitter PCB coil 6 and the standard coil, e.g. a Qi coil, are the transmitter coil structure. The standard Qi copper coil is usually made of a single core copper wire, multiple strand Litz wire, or few layers of PCB copper trace to form a transmitter coil with few windings turns. The Qi charging operates at sub 1 MHz frequency with micro-Henry scale inductance. The design structure of the Qi-standard coil is usually spiral or helical shape with several winding turns. The transmitter PCB coil 6 utilizes the PCB copper trace with few loops turns at a couple of PCB layers to form the transmitter coil. The design structure of the transmitter coil 2 is the ground trace sandwiches the transmitter coil trace at a certain side edge. The Qi standard copper coil has much higher inductance compared to the transmitter coil 2 due to a higher number of winding turns. However, a higher number of Qi-standard copper coil winding turn cause it to have a higher resistance than the transmitter PCB coil 6.

Apart from the physical coil structure difference, the transmitter PCB coil 6 has a different tuning capacitor circuit and cross talk immunity. For the tuning capacitor circuit, the Qi standard copper coil normally using a series connection capacitor. For the charging coil 2, the tuning capacitors circuit is arranged in parallel series as shown in FIG. 6. The resultant will be a parallel series resonance that drives a higher current through the PCB coil 6 to create a strong charging magnetic field. Overall, the parallel series capacitor arrangement has the features of input impedance adjustment, resonant frequency tuning, and antiphase voltage at the coil terminal (differential).

For the standard Qi charging copper coil, the magnetic field emission of the copper coil normally looping along the copper coil trace. The magnetic field looping is flowing everywhere along the copper trace. This free-flowing of the magnetic field can be concluded as there is no constraint to the magnetic field emission of standard Qi charging copper coil. Thus, the standard Qi charging copper coil can easily interfere with the emitted magnetic field from another channel nearby. The interference across two channels is termed as crosstalk. The crosstalk is defined as unwanted signals in a communication channel caused by energy transference from another circuit.

Figure 9:
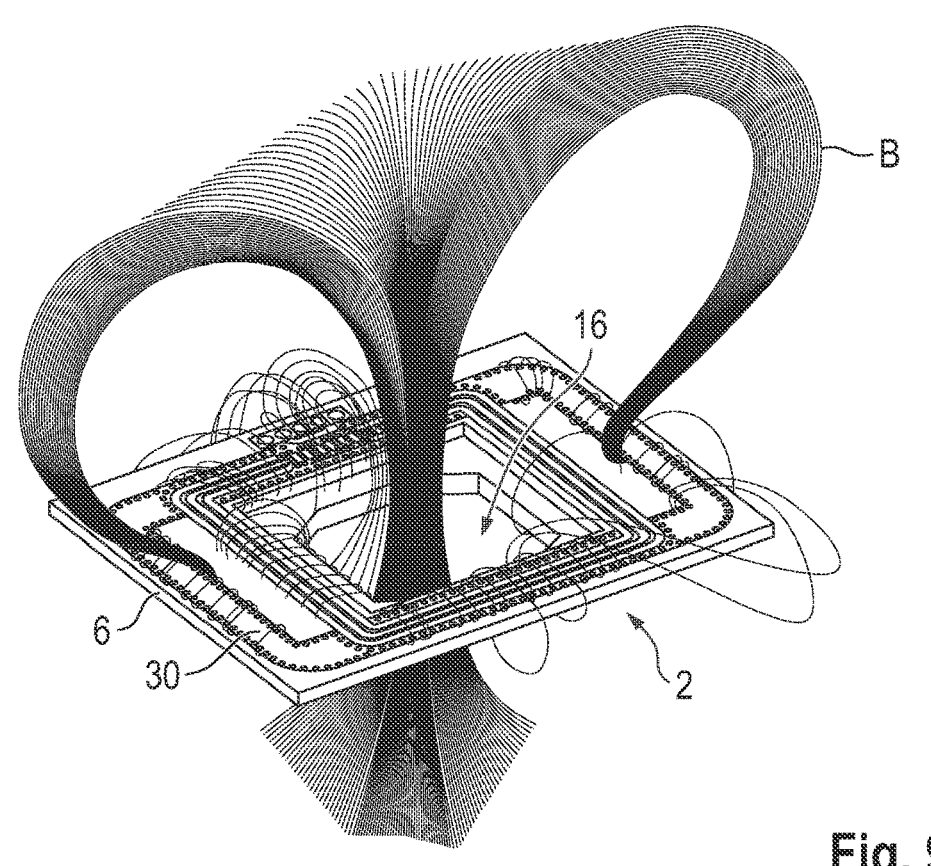
FIG. 9 is a perspective view of a magnetic field simulation for the charging coil.

The transmitter PCB coil 6 can constrain the emission of the magnetic field and prevent the magnetic field flows out from the antenna in a certain area. FIG. 9 shows a simulation of the PCB coil magnetic field emission with the loaded condition. The emitted magnetic field B converges at the opening 16, i.e. at the receiver, and reverts to the transmitter plane at the area in between the copper coil trace 32 and the ground trace 30. At the transmitter PCB coil plane, the top and bottom side show the magnetic field is concentrated at the copper trace but not emitted out from the copper coil trace. This magnetic field emission constraint is due to the ground reference copper trace 30 shielding and restricting the emission of the magnetic field B. This magnetic field shielding design has a similar concept as a coaxial cable which utilizes the ground reference trace to cover the waveguide trace. The magnetic field emission constraint can avoid crosstalk in between antenna to another antenna when they are placing near to each other. The crosstalk suppression allows the communication between receiver and transmitter that has very minor interference from another nearby channel.

For the hearing aid charger or MR charger 4, a transmitter charger case 52 is to position the hearing aid device. The transmitter coil 2 is placed inside the charger case 52. FIG. 10 shows the transmitter charger case 52 for an ITE hearing aid. The hearing aid usually comes in a pair, so the charger case is designed for two channels. The charger case 52 is preferably in ellipse shape as shown in FIG. 10. This ellipse shape charger case can create a view effect that makes the charger become an elegant product. For integrating the charging coil 2 into the charger case 52, the size of the charging coil 2 is preferably reduced.

The transmitter PCB coil size reduction can be made by trimming all the corners and the copper trace at both left and right-side edges. In other words, the trimming of the transmitter PCB coil left side edge and right-side edge means to reduce the width of the ground reference copper trace 30. However, the implementation of edge trimming for the transmitter PCB coil 6 can cause a reduction of the quality factor. The edge trimming transmitter coil design is termed here as a trimmed edge transmitter (PCB) coil 2'.

Figure 11:
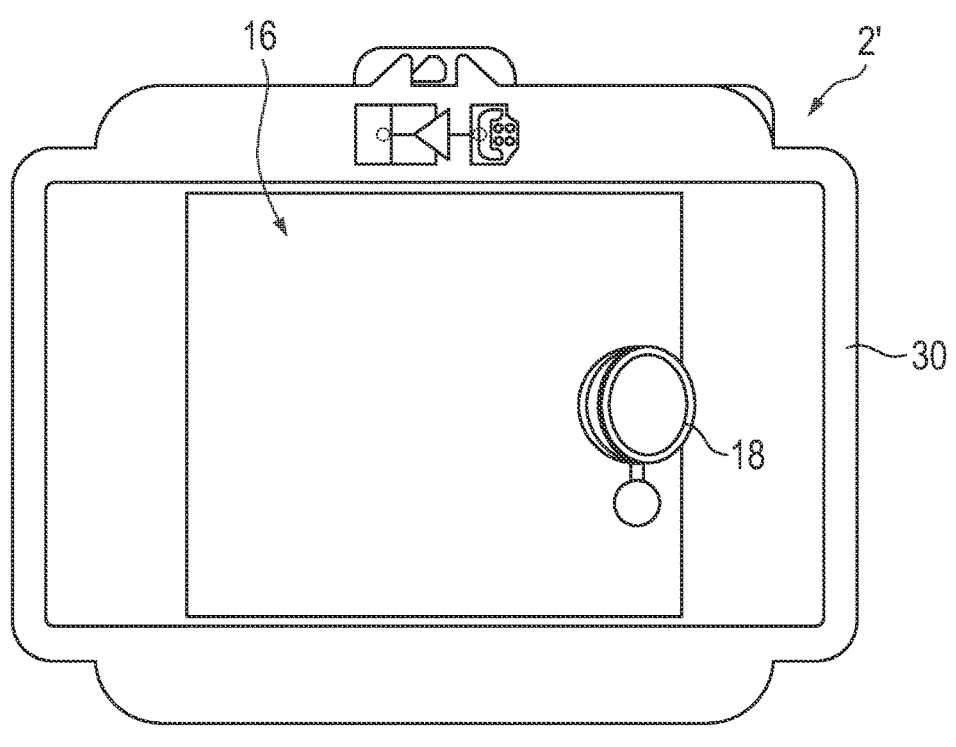
FIG. 11 is a top view showing a PCB coil with trimmed edges.

FIG. 11 shows the top view of the trimmed edge transmitter coil 2'. In the overall dimension, the trimmed edge transmitter coil 2' has a significant dimension reduction at the horizontal length and a slight reduction in vertical length compare to the untrimmed coil design. To maintain the quality factor of trimmed edge transmitter coil 2' as the original transmitter coil design shown in FIG. 2, there are several quality factor enhancement methods such as adding a ground reference to inner layers, employ thicker copper trace to all the layer, multiple layers copper coil trace combination. Besides, the coupling factor can be enhanced by adding a ferrite strip 54, and adding ferrite to the hollow area.

Figure 12A:
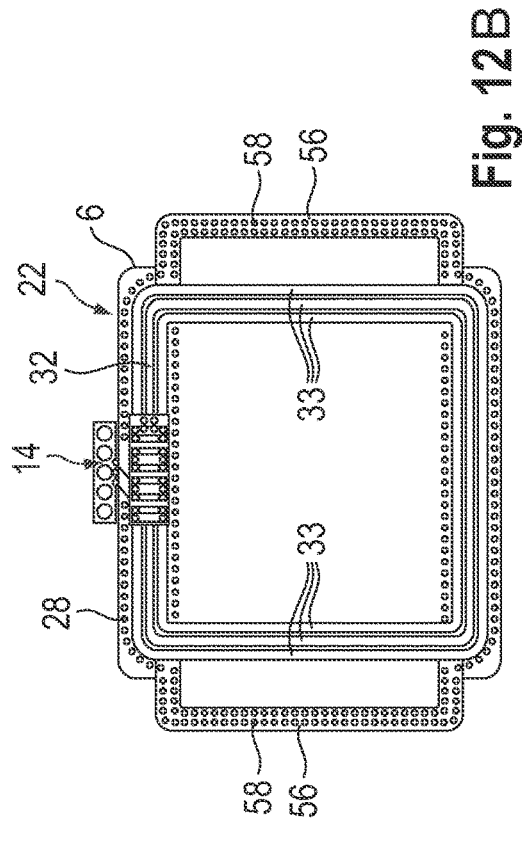
FIGS. 12A to 12D are top views showing layers of the PCB coil with ground reference in all layers.
Figure 12B:
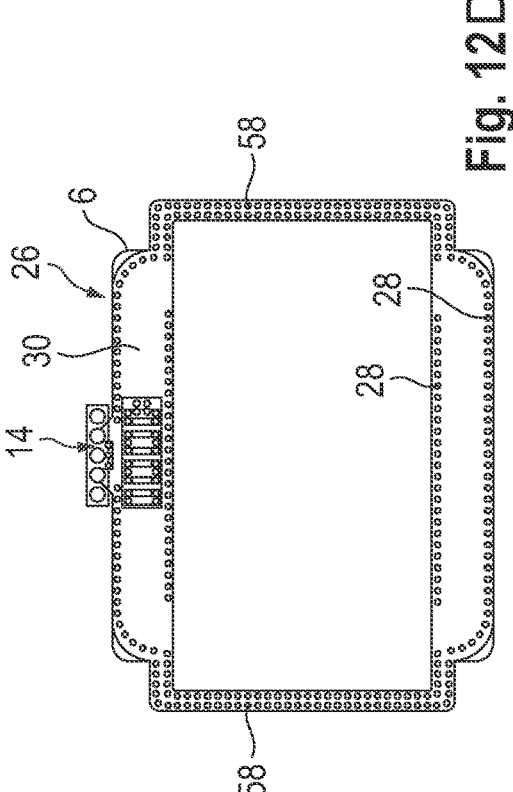
Figure 12C:
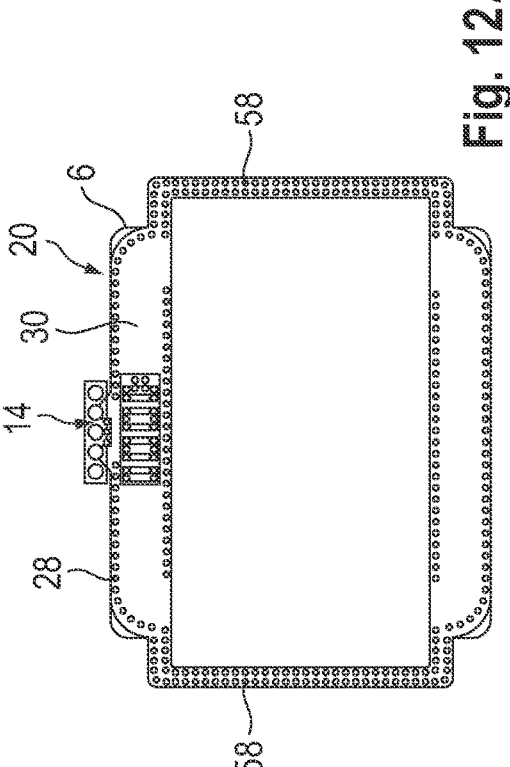
Figure 12D:
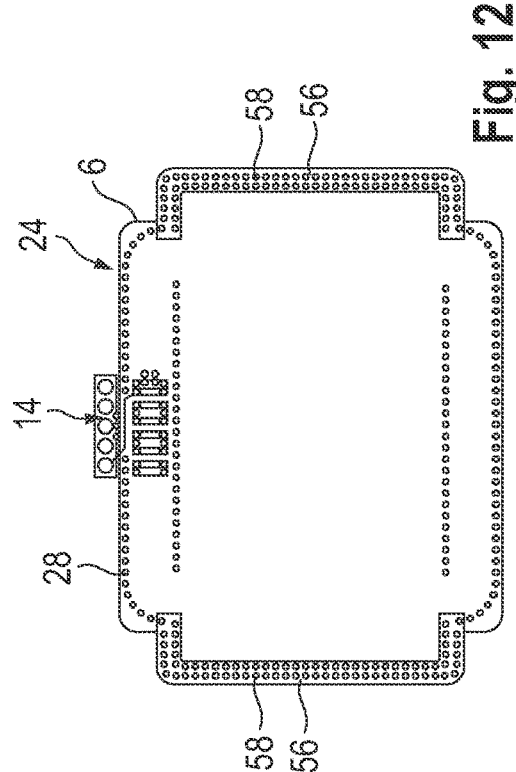
Figures 13A, 13B, 13C, 13D:
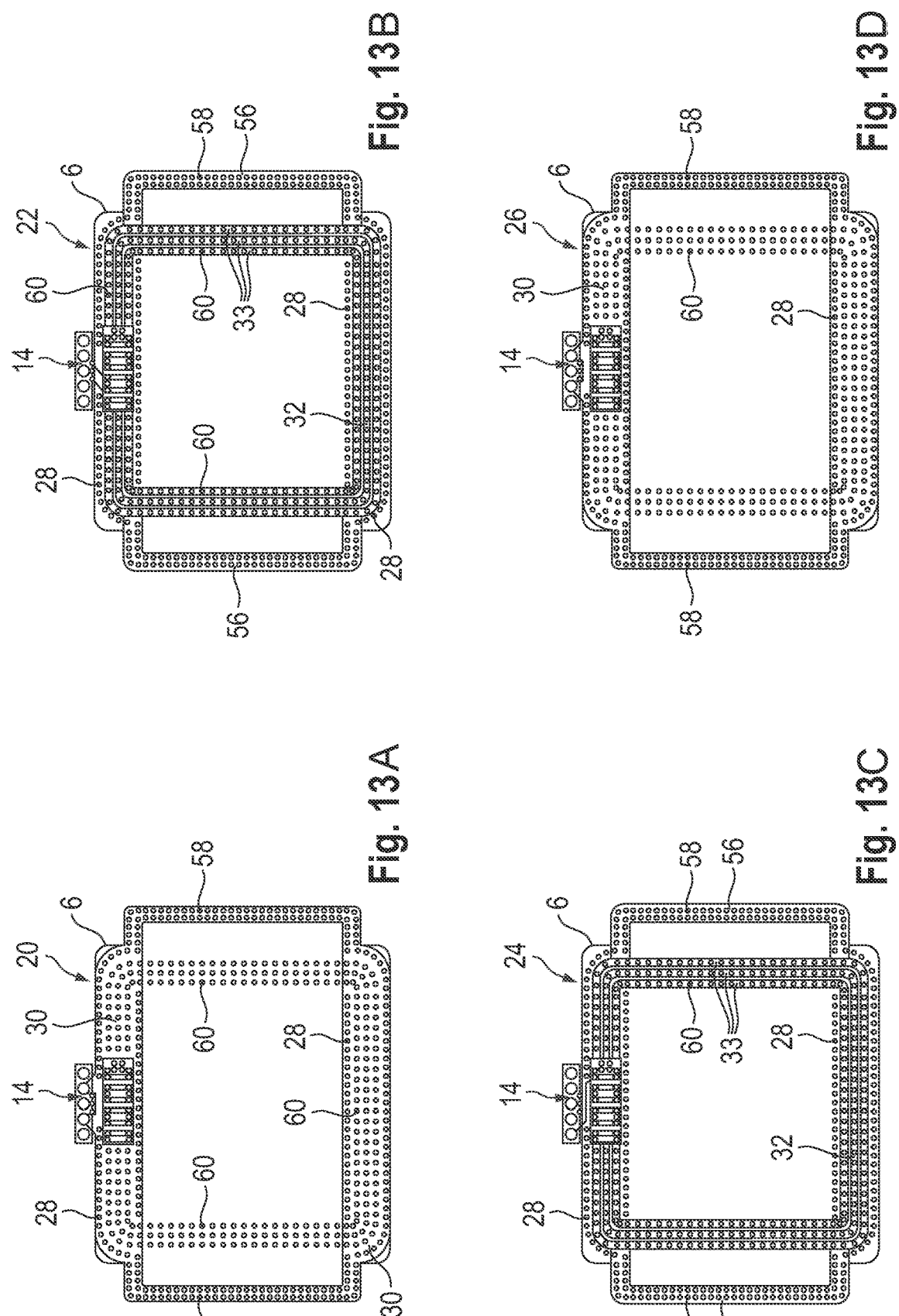
FIGS. 13a to 13d are top views showing the layers of the PCB coil with a multilayer coil conductor.

In the following, adding a ground reference to all layers of the PCB coil 6 is explained in more detail using the FIGS. 12A to 12D. FIG. 12A illustrates the top layer 20, FIG. 12B the first inner layer 22, FIG. 12C the inner layer 26, and FIG. 12D the bottom layer 26 of the trimmed edge transmitter coil 2'. Similar to the original transmitter PCB, the trimmed edge of the transmitter PCB coil design can be one winding turn or more. The winding turns of the transmitter PCB coil is less than the PCB number of layers. A ground reference trace is added as a conductor strip 56 to the left side and right-side edge copper trace 32 of all the PCB inner layers 22, 24. This means the trimmed edge transmitter design has additional ground reference trace to the inner layer 22 and inner layer 24 at the left and right edge compare to the transmitter PCB coil 2. The ground reference trace of each layer is connected through a number of axial vias 58. With the width reduction of the ground layer copper trace is thereby compensated by adding the copper trace 56 to all the inner layers 22, 24 and punch vias 58 to connect all the PCB layers along the ground reference copper trace.

Increasing the thickness of the PCB copper traces has a result of low resistance and higher quality factor. However, increase copper trace thickness can increase overall manufacturing cost exponentially at the same time. Hence, a reasonable copper trace thickness must be made to compromise the manufacturing cost and quality factor. The transmitter PCB coil 2 copper thickness is e.g. 1 oz at the outer layer 20, 26 and 1.5 oz at the inner layer 22, 24. To further lower the overall transmitter PCB coil resistance, the copper trace thickness is increased to 2 oz for all the layers 20, 22, 24, 26 for the trimmed charging coil 2'. This copper trace thickness increment can compensate for the width reduction of ground reference copper trace.

Using the same trimmed edge transmitter PCB coil dimension, one can increase the quality factor by punching buried vias 60 along the copper coil traces to merge multiple layers of copper traces 32 into one winding turn copper trace. The merger of copper coil trace 32 will result in coil inductance reduction but it will reduce the resistance significantly at the same time. The quality factor is proportional to inductance and inversely to the resistance. Overall, punching vias 60 along the copper coil trace 32, 33 can increase the quality factor due to large resistance reduction. FIG. 13A to 13D show the design of such a buried vias trimmed edge transmitter PCB coil 2". The buried vias 60 are added along all the copper coil traces 32, 33. The buried vias 60 connect the inner layers 22, 24 together but exclude out the outer layers 20, 26. These vias 60 merge the multiple parallel copper traces 32 into one turn winding.

Figure 14A:
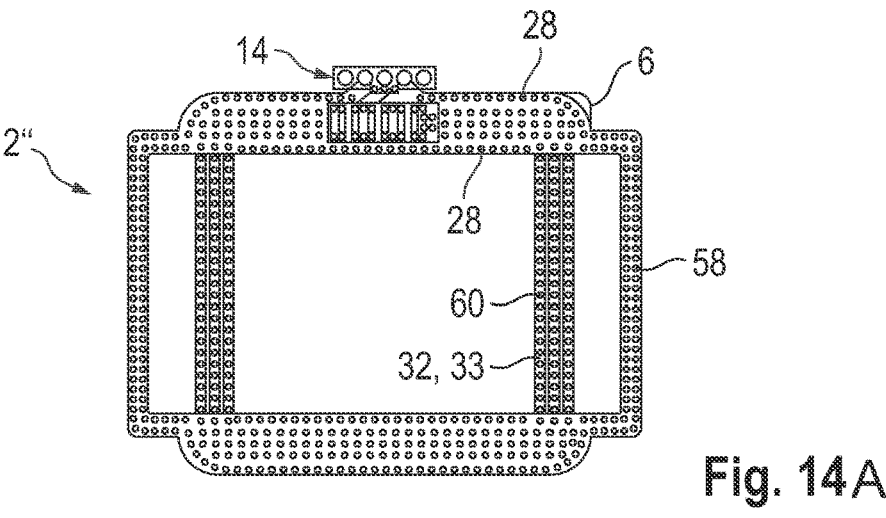
FIG. 14A to 14C are top views of a PCB coil with different buried vias placements.
Figure 14B:
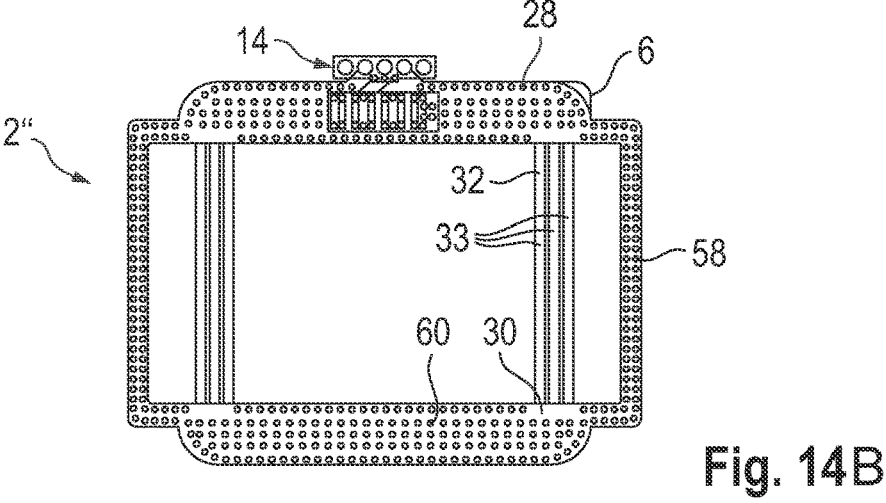
Figure 14C:
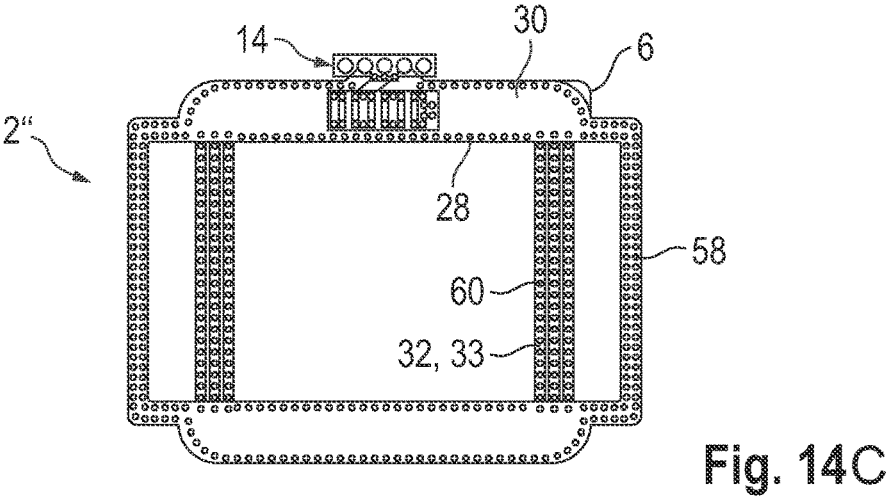

For the buried via punching method, there are three trimmed edge transmitter PCB coil designs which are 1) buried vias placed at the top and bottom copper coil trace, 2) buried vias placed at the top, bottom, left, right copper coil trace, 3) buried vias place at the left and right copper coil trace. All the different buried via punching placement design are shown in FIG. 14A to 14C. These three different buried vias placement designs generate different quality factor result.

In the embodiment of FIG. 14A the top, bottom, left, and right copper coil trace buried via punching. In the embodiment of FIG. 14B the top and bottom copper coil trace buried via punching, and in the embodiment of FIG. 14C the left and right copper coil trace buried via punching.

Figure 15:
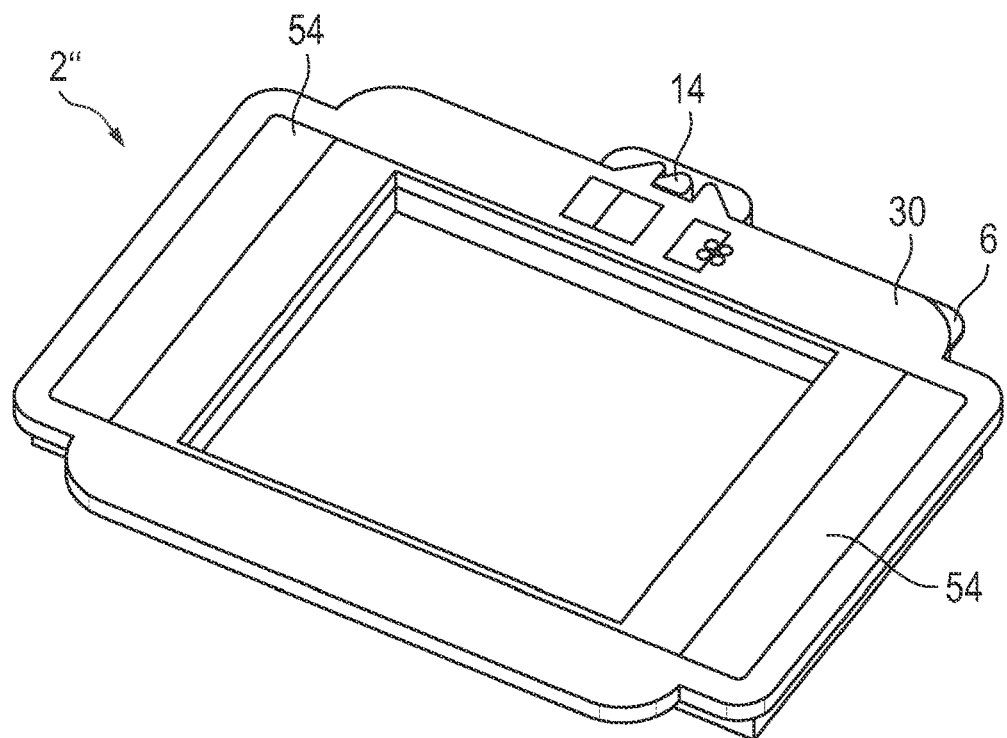
FIG. 15 is a perspective view a charging coil with ferrite arms.
Figure 16:
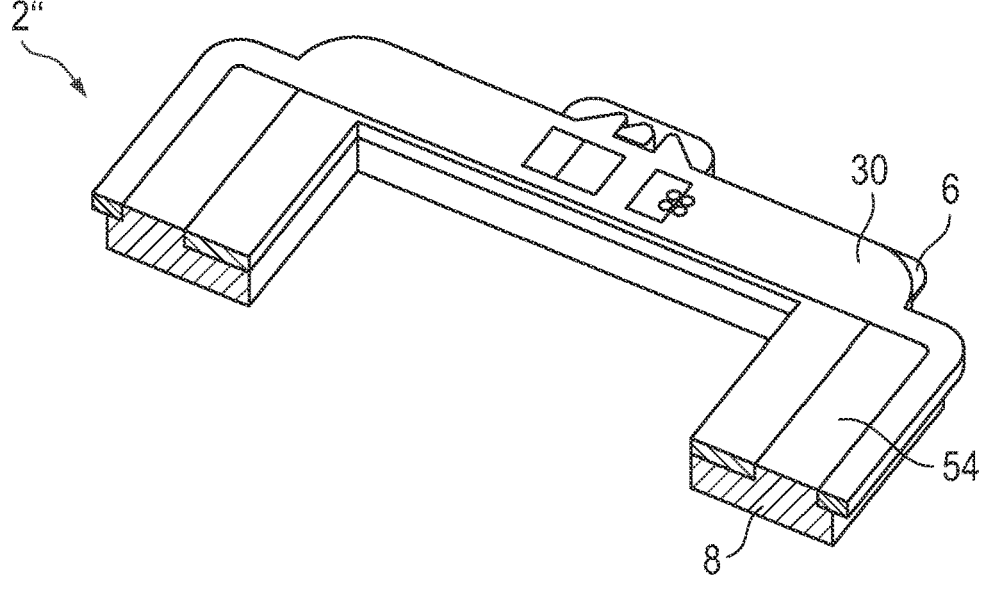
FIG. 16 is a perspective, sectional view of the charging coil according to FIG. 15.

In the following, adding a ferrite strip 54 is explained in more detail using the FIGS. 15 and 16. In the extension of performance improvement, the FR4 material of the transmitter PCB coil between the transmitter copper coil trace 32 and ground reference trace 30 can be trimmed out and replace with a ferrite strip 54. The trimmed-out zone is termed here as transmitter PCB coil arm. The trimmed out left and right arms are replaced with a ferrite strip 54. FIGS. 15 and 16 show the trimmed edge transmitter PCB coil with ferrite arms. A thicker ferrite strip 54 added to the transmitter PCB coil arm can achieve a higher inductance and a higher quality factor. The quality factor enhancement by adding a ferrite strip 54 to the transmitter PCB coil arms will result in a higher coupling factor between receiver and transmitter and achieve better charging efficiency. The ferrite strip 54 added to the arms has to be at least a minimum thickness of the transmitter PCB coil.

Figure 17:
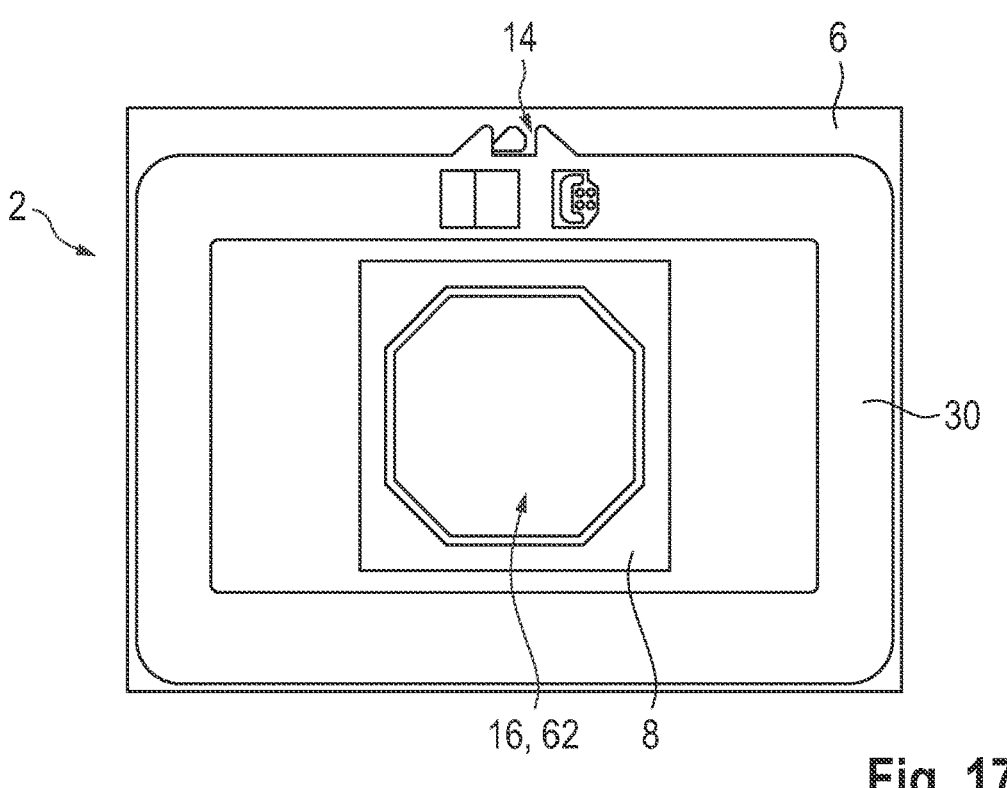
FIGS. 17 and 18 top views showing a charging coil with a ferrite tile extending into a central hollow area.

In the following, adding ferrite to the hollow area of the opening 16 is explained in more detail using the FIG. 17 and FIG. 18. More ferrite to the transmitter PCB coil can enhance the coupling factor. Hence, filling up the hollow area of the opening 16 with ferrite is a solution to achieve a better coupling factor between transmitter and receiver. In turn, the coupling factor enhancement by adding ferrite can result in higher charging efficiency. The ferrite hole 62 can be in any shape and the hole is for the inlay insertion to place the ITE HA 18 in any intuitive manner. Generally, a smaller hole has a result of a higher coupling factor and better charging efficiency. This result is due to more ferrite added to the PCB coil 6. FIG. 17 shows an example of added ferrite to the hollow area of the transmitter coil 2. The hollow area is filled up with a ferrite with an octagon opening hole 62.

Figure 18:
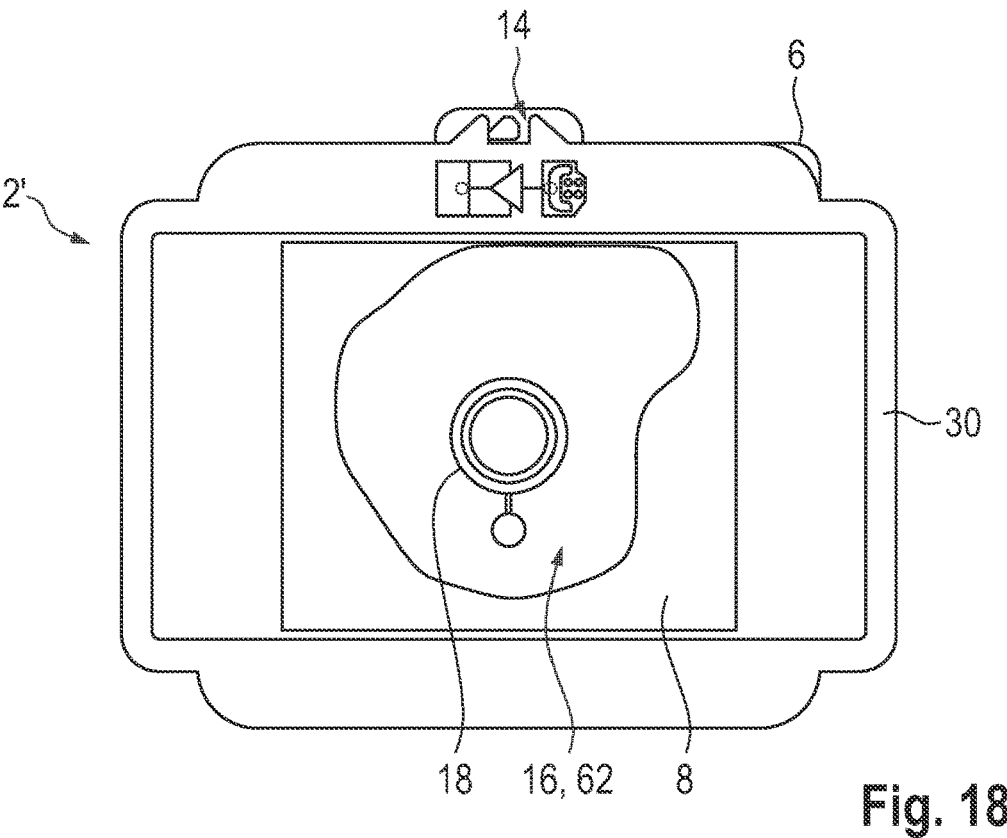

FIG. 18 shows ferrite added to the hollow area of the trimming edge transmitter PCB coil 2'. A smaller contour at the hollow area generally has a higher coupling factor.

For the cross-talk suppression, there are two effective methods used in the hearing aid charger 4, which are transmitter PCB coil arrangement, and employ an electrically conductive material bracket 64.

Figure 19:
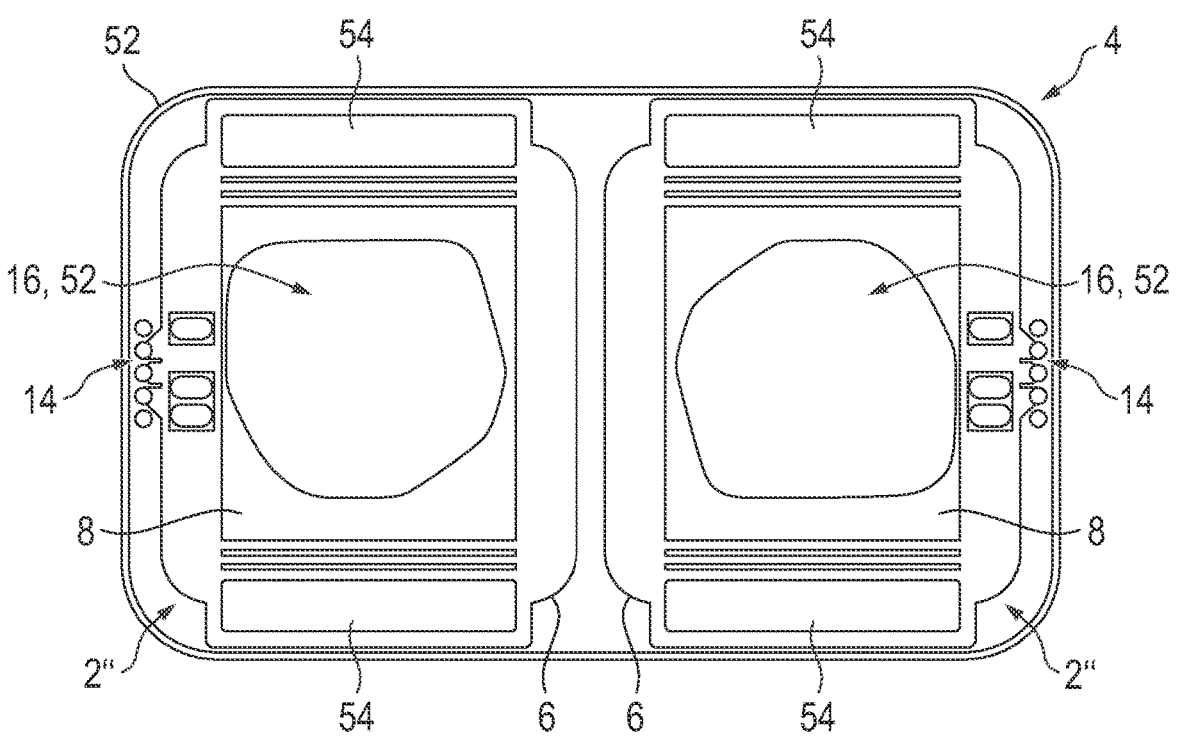
FIG. 19 is a top view showing an arrangement of two charging coils for a hearing aid charger.
Figure 20:
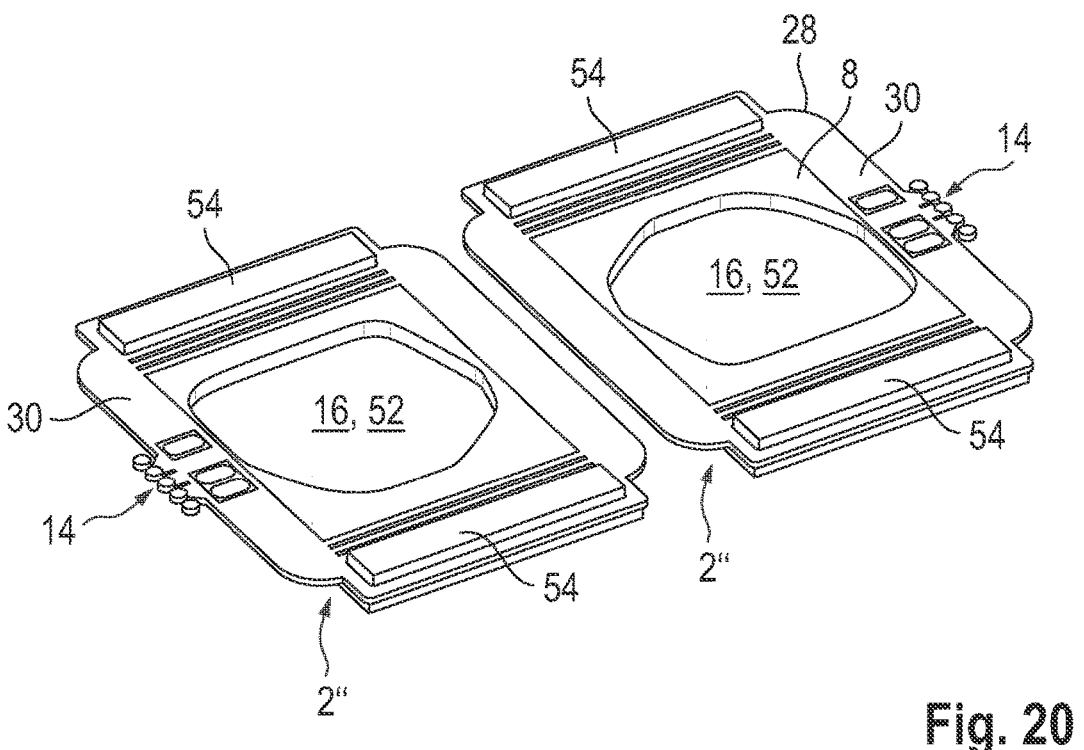
FIG. 20 is a perspective view showing a simulation of a magnetic field interference for the coil arrangement.

In the following, the arrangement of the charging coils 2, 2', 2" in the charger case 52 is explained in more detail using the FIG. 19 and FIG. 20. In the embodiments of FIGS. 19 and 20 two charging coils 2" are shown. However, the following comments can also be applied to the charging coils 2, 2".

The left and right transmitter PCB coils 2" are proposed to arrange in the manner of the bottom of the transmitter PCB coil 2" facing the bottom of the next channel transmitter PCB coil 2". FIG. 19 shows the bottom-to-bottom arrangement of transmitter PCB coils 2" in the charger case 52. The bottom part of the transmitter PCB coil has a magnetic field emission shielding feature. The magnetic field emission shielding feature is realized by designing the outer layer 20, 26 ground reference trace 30 of the transmitter PCB coil 2" sandwiches the inner layers 22, 24 copper coil trace 32 of the transmitter. The magnetic field emission shielding feature results in minimizing the interference of the signal to the other channel.

A simulation is carried out to test the magnetic field interference of the bottom-to-bottom transmitter PCB coil arrangement. The test is conducted with one transmitter coil is power up and the other channel transmitter coil is power off. FIG. 20 shows the simulation result of magnetic field interference for the transmitter PCB coil with the bottom to the bottom arrangement. The channel on right is turn on to emit magnetic energy and the channel on left is in idle mode. The simulation result shows the bottom-to-bottom arrangement has a minimum impact of crosstalk from one transmitter PCB coil to the adjacent transmitter PCB coil.

Figure 21:
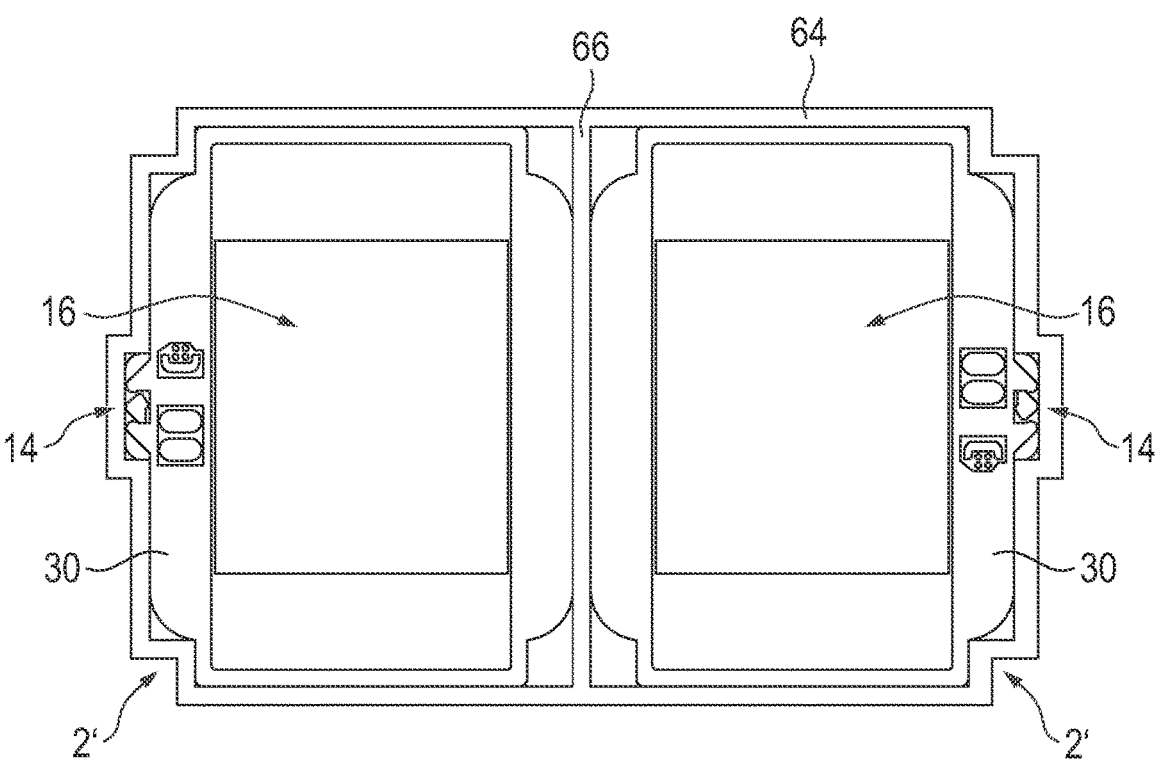
FIG. 21 is a top view showing an aluminium bracket covering the coil arrangement.
Figure 22:
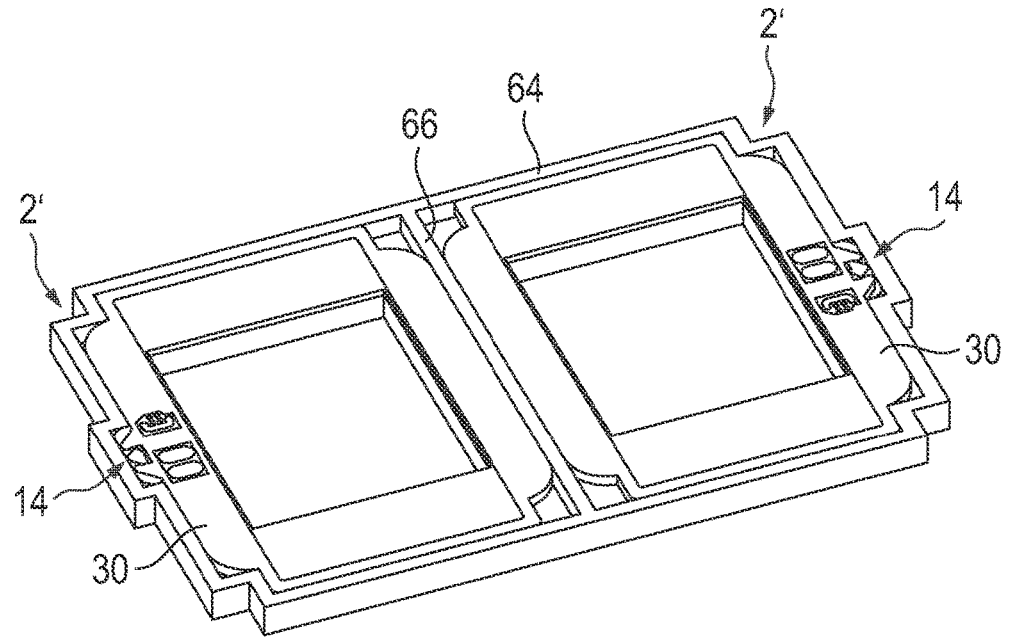
FIG. 22 is a perspective view showing an aluminium bracket covering the coil arrangement.

To further suppress the crosstalk effect, an electrically conductive material strip with low permeability can be added in between two transmitter PCB coils to block the electromagnetic field. This is shown in the FIGS. 21 and 22, wherein charging coils 2' are used as an example embodiment. Aluminium is one of the selected materials due it has the properties of electrically conductive, low permeability, and low cost. The aluminium is made into the bracket 64 for cross-talk effect suppression. FIG. 21 shows the aluminium bracket 64 covers two transmitter PCB coils 2' with a middle strip or central web 66. The middle strip 66 of the bracket 64 can further suppress the crosstalk effect between two channels.

Figure 23A:
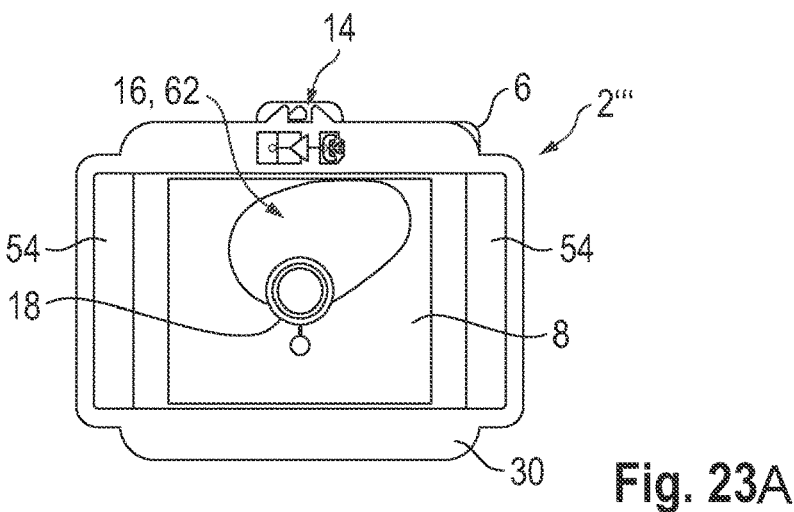
FIGS. 23A to 23C are top views showing different contour sizes of the ferrite tile in the hollow charging coil area.
Figure 23B:
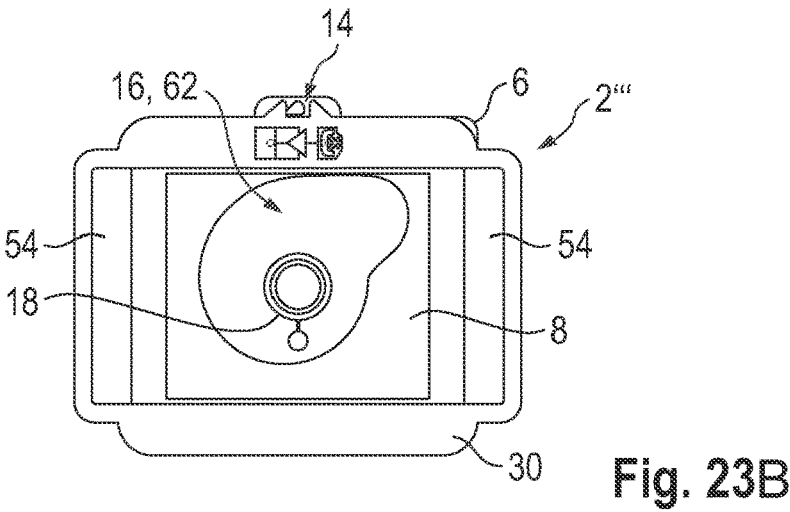
Figure 23C:
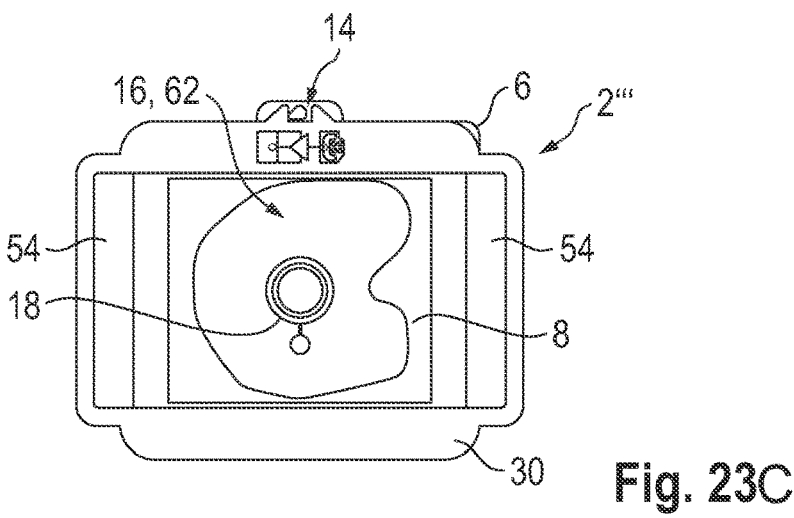

In the following the charging coil types are compared. The compared types include the transmitter PCB coil 2, the trimmed edge buried via transmitter PCB coil 2″, and trimmed edge buried via transmitter PCB coil 2‴ with ferrite arms 54 (FIGS. 23A to 23C). The inductance, resistance, and quality factor measurement of each different transmitter PCB coil design are recorded and shown in the following table:

ferrite is implemented by adding a ferrite strip to the transmitter PCB coil arms and fill up the hollow hole with a small contour. The measurement result shows more ferrite added to the transmitter PCB coil has a higher quality factor and a higher inductance compare to the original flat ferrite tile transmitter PCB coil with no filled up at the hollow hole.

| Design | No Ferrite Tile | | | With Ferrite Tile | | |
|---|---|---|---|---|---|---|
| | L(nH) | Q | R(mΩ) | L(nH) | Q | R(mΩ) |
| Transmitter PCB coil design with 1 winding turn (FIG. 2) | 52.05 | 86.266 | 51.41 | 63.96 | 95.62 | 56.99 |
| Transmitter PCB coil design with 2 winding turn (FIG. 2) | 187.17 | 78.14 | 204.09 | 246.7 | 83.92 | 250.47 |
| Trimmed edge transmitter PCB coil design with 1 winding turn (FIG. 11, FIG. 18) | 55.18 | 81.52 | 57.44 | 67.77 | 90.92 | 65.40 |
| Trimmed edge transmitter PCB coil design with buried vias at the top, bottom, left, right plane copper coil trace (FIG. 14a) | 48.62 | 92.33 | 45.00 | 64.77 | 105.81 | 52.20 |
| Trimmed edge transmitter PCB coil design with buried vias at the top and bottom copper coil trace (FIG. 14b) | 47.72 | 95.30 | 42.50 | 63.99 | 106.60 | 51.11 |
| Trimmed edge transmitter PCB coil design with buried vias at the left and right plane copper coil trace (FIG. 14c) | 49.78 | 91.13 | 46.44 | 66.45 | 101.87 | 55.90 |
| Trimmed edge transmitter PCB coil design with buried vias at the top and bottom copper coil trace with ferrite arms and ferrite filled up to hollow hole with small contour (FIG. 15, FIG. 16, FIG. 18) | 47.72 | 95.30 | 42.50 | 73.48 | 140 | 44.70 |

In the overall measurement result, the PCB coil 6 attached with ferrite tile 8 shows higher inductance and higher quality factor than the transmitter without ferrite tile 8. Taking the transmitter coil 2 design as a comparison, the measurement result shows one winding turn has a higher quality factor than two winding turns design. This is due to one winding turn transmitter PCB coil has a significant lower resistance than two winding turns transmitter PCB coil.

Using one winding turn as a comparison, the trimmed edge transmitter PCB coil 2′ has a slightly lower quality factor than the transmitter PCB coil 2 due to higher resistance. The trimmed edge transmitter PCB coil design show not much dropping in quality factor compared to the transmitter PCB coil 2. This result is due to the compensation of increased copper trace thickness and adding ground reference trace to multiple layers. This measurement result can conclude that the width of the copper trace has a significant impact on the quality factor. One can also manipulate the quality factor reduction through transmitter PCB coil design by adding a ground reference trace to multiple layers and increasing the copper trace thickness.

Taking a comparison between the trimmed edge transmitter PCB coil design 2′ and all the buried via trimmed edge transmitter PCB coil 2″ design, the measurement result shows the merger of multiple layers copper coil traces can further improve the quality factor. The resistance reduction is the factor of quality factor enhancement. Among all the buried vias transmitter PCB coil design, the measurement result shows buried via placed at the top and bottom copper coil trace has the highest quality factor due to the lowest resistance. This measurement results indicate the resistance reduction is not directly related to the number of buried vias.

A comparison is made in between adding more ferrite to the transmitter PCB coil and without adding ferrite. More This result can conclude the adding ferrite strip 54 can further increase the performance of the transmitter PCB coil.

The measurement results can conclude with adding ferrite tile 8, increase copper thickness, merging copper trace of multiple layers using buried vias 60, and adding ferrite strips 54 to arms can enhance the performance of the transmitter PCB coil.

In the following, the effect of different ferrite contour sizes of the ferrite hole 62 are explained in more detail using the FIGS. 23A to 23C. Three different ferrite contour sizes at the hollow hole 16 of the transmitter PCB coil 2‴ were simulated to compare overall charging efficiency. A small contour (FIG. 23A) implies more ferrite added to the transmitter PCB coil hollow area 16. A transmitter and a receiver must exist in the wireless charging system to test overall wireless charging efficiency. The receiver is positioned at the center of the transmitter PCB coil 2‴. The receiver is in the form of a pure battery module with a receiver coil. This simulation is to justify the claim of adding more ferrite to the hollow area can enhance the charging performance. The simulation result of different ferrite contour sizes is shown in the following table:

| | Overall System charging Efficiency % | |
|---|---|---|
| | Without ferrite strips to arm | With ferrite strips to arm |
| Small contour size (FIG. 23a) | 12.43 | 13.46 |
| Middle contour size (FIG. 23b) | 11.72 | 12.73 |
| Large contour size (FIG. 23c) | 11.37 | 12.37 |

The simulation result shows the small ferrite contour size has the highest charging efficiency. This result is due to a better coupling factor between transmitter and receiver when more ferrite is added to the transmitter. Besides, the simulation result also shows adding ferrite strips 54 to the transmitter PCB coil arms can achieve a better charging efficiency. Roughly 1% increment of charging efficiency for the added ferrite strip 54 to transmitter PCB coil arms compare with non-added ferrite arms. This measurement result verifies the claims of more ferrite added to the transmitter PCB coil can achieve a better coupling factor between the transmitter and receiver.

Figure 24:
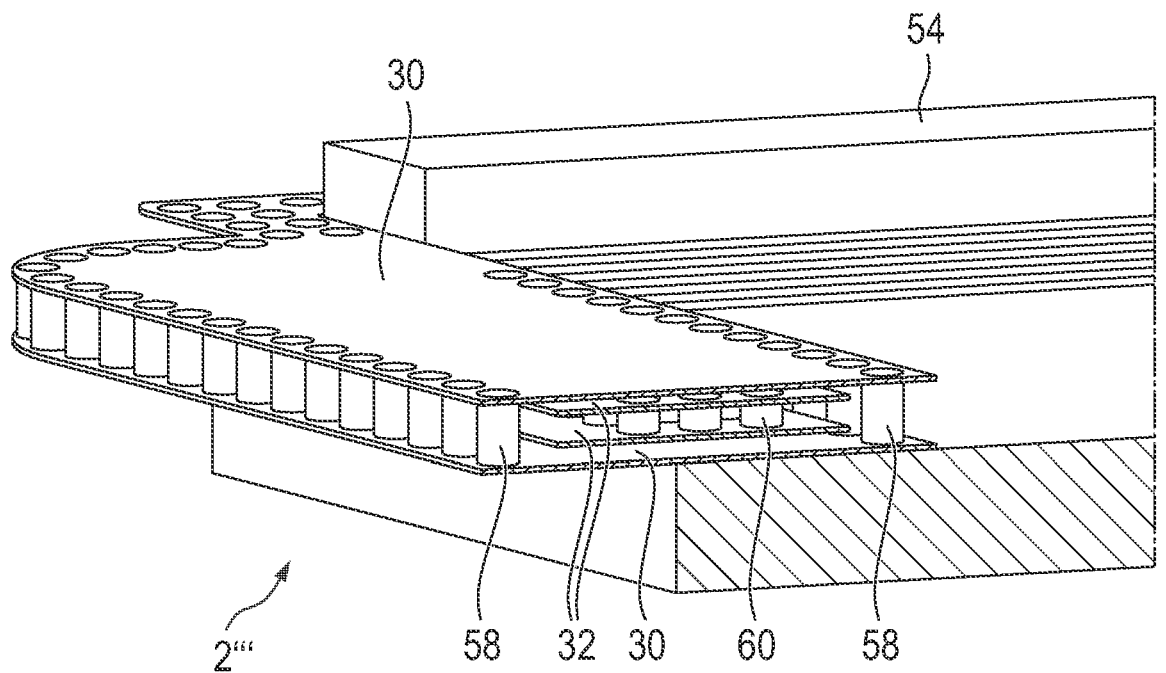
FIG. 24 is a sectional view of the coil arrangement.

FIG. 24 shows a sectional view of the coil arrangement 2′″ and the forming of single turn winding coil by using multiple layer copper trace and the third axial vias (buried via) 60.

The invention is not limited to the embodiments described above. Rather, other variants of the invention can be derived from it by the person skilled in the art without leaving the subject of the invention. In particular, all the individual features described in connection with the embodiments can also be combined with one another in other ways without leaving the subject matter of the invention.

The following is a summary list of reference numerals and the corresponding structure used in the above description of the invention.

LIST OF REFERENCE SIGNS

2, 2′, 2″, 2′″ charging coil/transmitter PCB coil
4 hearing aid charger
6 PCB coil
8 ferrite tile
10 capacitor
12 thermistor
14 pin header
16 opening
18 hearing aid
20 outer layer, top layer
22 inner layer
24 inner layer
26 outer layer, bottom layer
28 vias
30 copper trace
32 coil conductor
33 conductor path
34 start
36 . . . 50 step
52 charger case
54 ferrite strip
56 conductor strip
58 vias
60 vias
62 ferrite hole
64 bracket
66 web
C1 . . . C6 capacitance
Ceq, Ca, Cb capacitance
L inductance
V1, V2 voltage
P1 . . . P5 pin
B magnetic field
The invention claimed is:

1. A charging coil for a hearing aid charger, the charging coil comprising:
   a printed circuit board coil; and
   a frame shaped ferrite tile with a central opening formed therein for receiving a hearing aid, wherein said printed circuit board coil is disposed on said frame shaped ferrite tile;

wherein said printed circuit board coil has layers including two outer layers as ground reference and at least one inner layer with a coil conductor disposed in between said two outer layers for generating a magnetic field.

2. The charging coil according to claim 1, wherein said outer layers are connected by a plurality of first axial vias.

3. The charging coil according to claim 2, wherein said coil conductor is surrounded by said plurality of first axial vias.

4. The charging coil according to claim 1, wherein at least one of:
   said at least one inner layer contains at least one conductor strip flanking said coil conductor, and said at least one conductor strip is connected to said outer layers by a plurality of second axial vias; or
   edges of said layers are trimmed; or
   said coil conductor has a plurality of parallel disposed conductor paths; or
   two opposite sides of said outer layers cover said at least one inner layer; or
   one of said outer layers is in contact with said frame shaped ferrite tile.

5. The charging coil according to claim 1, wherein said at least one inner layer of said printed circuit board coil is one of at least two stacked inner layers, each of said at least two stacked inner layers including a coil conductor, and wherein each coil conductor of said at least two stacked inner layers are connected by a plurality of third axial vias.

6. The charging coil according to claim 1, wherein said outer layers are rectangular-shaped with two long sides and two short sides, wherein said at least one inner layer is square-shaped, and wherein a length of square sides of said at least one inner layer corresponds to a length of said short sides of said outer layers.

7. The charging coil according to claim 6, wherein an area of said layers between said short sides and said square sides parallel to said short sides is trimmed out and filled with a ferrite strip.

8. The charging coil according to claim 7, wherein said frame shaped ferrite tile is made in one piece with said ferrite strip.

9. The charging coil according to claim 1, wherein said central opening is at least partially filled with ferrite material.

10. The charging coil according to claim 1, wherein material of said frame shaped ferrite tile has a loss tangent smaller than 0.004 at a resonance frequency used for magnetic resonance charging.

11. A hearing aid charger, comprising:
   a charger case; and
   at least one charging coil according to claim 1 integrated in said charger case.

12. The hearing aid charger according to claim 11, further comprising a bracket with a central web; and
   wherein said at least one charging coil is one of two charging coils integrated in said charger case, and wherein the charging coils are disposed in said bracket with said central web separating said charging coils.

13. The hearing aid charger according to claim 12, wherein said bracket is made of an electrically conductive material with low permeability.

14. A wireless charging system, comprising:
   an in-the-ear hearing aid with a receiver coil and a hearing aid charger according to claim 11.

15. A charging coil for a hearing aid charger, the charging coil comprising:

a printed circuit board coil;

a frame shaped ferrite tile with a central opening formed therein for receiving a hearing aid, wherein said printed circuit board coil is disposed on said frame shaped ferrite tile; and a tuning circuit integrated into said printed circuit board coil;

wherein said printed circuit board coil has layers including two outer layers as ground reference and at least one inner layer with a coil conductor disposed in between said two outer layers for generating a magnetic field.

16. The charging coil according to claim 15, wherein said tuning circuit has a parallel resonance circuit with said coil conductor as inductance.

17. The charging coil according to claim 16, wherein a resonance frequency of said parallel resonance circuit is 13.56 MHz.

18. The charging coil according to claim 15, wherein said tuning circuit has a number of capacitors which are connected in series.

19. The charging coil according to claim 15, wherein said tuning circuit has a thermistor for measuring a temperature of said printed circuit board coil.

20. The charging coil according to claim 19, wherein said thermistor is disposed between one of said outer layers facing said frame shaped ferrite tile and an adjacent said at least one inner layer.

21. The charging coil according to claim 15, further comprising a pin header for contacting said tuning circuit, said pin header is disposed on one of said outer layers.

22. The charging coil according to claim 15, wherein said central opening is at least partially filled with ferrite material.

23. The charging coil according to claim 15, wherein material of said frame shaped ferrite tile has a loss tangent smaller than 0.004 at a resonance frequency used for magnetic resonance charging.

24. A hearing aid charger, comprising:

a charger case; and at least one charging coil according to claim 15 integrated in said charger case.

25. The hearing aid charger according to claim 24, further comprising a bracket with a central web; and wherein said at least one charging coil is one of two charging coils integrated in said charger case, and wherein the charging coils are disposed in said bracket with said central web separating said charging coils.

26. The hearing aid charger according to claim 25, wherein said bracket is made of an electrically conductive material with low permeability.

27. A wireless charging system, comprising:

an in-the-ear hearing aid with a receiver coil and a hearing aid charger according to claim 24.

* * * * *